United States Patent
Bajaj et al.

(10) Patent No.: US 9,070,579 B2
(45) Date of Patent: Jun. 30, 2015

(54) GATE STRAIN INDUCED WORK FUNCTION ENGINEERING

(71) Applicant: International Business Machines Corporation, Armonk, NY (US)

(72) Inventors: Mohit Bajaj, Bangalore (IN); Kota V. R. M. Murali, Bangalore (IN); Rahul Nayak, Bhopal (IN); Edward J. Nowak, Essex Junction, VT (US); Rajan K. Pandey, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/515,702

(22) Filed: Oct. 16, 2014

(65) Prior Publication Data

US 2015/0035075 A1  Feb. 5, 2015

Related U.S. Application Data

(62) Division of application No. 13/409,630, filed on Mar. 1, 2012.

(51) Int. Cl.
*H01L 27/092* (2006.01)
*H01L 29/78* (2006.01)
(Continued)

(52) U.S. Cl.
CPC .......... *H01L 27/0922* (2013.01); *H01L 27/092* (2013.01); *H01L 21/823412* (2013.01); *H01L 21/82345* (2013.01);
(Continued)

(58) Field of Classification Search
None
See application file for complete search history.

(56) References Cited

U.S. PATENT DOCUMENTS

| 6,709,912 B1 | 3/2004 | Ang et al. |
| 7,229,873 B2 | 6/2007 | Colombo et al. |

(Continued)

FOREIGN PATENT DOCUMENTS

| KR | 10-2006-0033232 A | 4/2006 |
| KR | 10-2009-0097159 A | 9/2009 |

OTHER PUBLICATIONS

Matsuki, T. et al., "Impact of Gate Metal-Induced Stress on Performance Modulation in Gate-Last Metal-Oxide-Semiconductor Field-Effect Transistors" Japanese Journal of Applied Physics (Aug. 2007), pp. 3181-3184, vol. 46, No. 5B.

(Continued)

*Primary Examiner* — Angel Roman
(74) *Attorney, Agent, or Firm* — Scully, Scott, Murphy & Presser, P.C.; Yumani Cai

(57) ABSTRACT

A stack of a gate dielectric layer and a workfunction material layer are deposited over a plurality of semiconductor material portions, which can be a plurality of semiconductor fins or a plurality of active regions in a semiconductor substrate. A first gate conductor material applying a first stress is formed on a first portion of the workfunction material layer located on a first semiconductor material portion, and a second gate conductor material applying a second stress is formed on a second portion of the workfunction material layer located on a second semiconductor material portion. The first and second stresses are different in at least one of polarity and magnitude, thereby inducing different strains in the first and second portions of the workfunction material layer. The different strains cause the workfunction shift differently in the first and second portions of the workfunction material layer, thereby providing devices having multiple different workfunctions.

16 Claims, 22 Drawing Sheets

(51) Int. Cl.
*H01L 21/8234* (2006.01)
*H01L 21/8238* (2006.01)
*H01L 21/84* (2006.01)
*H01L 27/12* (2006.01)

(52) U.S. Cl.
CPC ... *H01L 21/823821* (2013.01); *H01L 27/0924* (2013.01); *H01L 21/845* (2013.01); *H01L 27/1211* (2013.01); *H01L 29/7845* (2013.01)

(56) References Cited

U.S. PATENT DOCUMENTS

| | | |
|---|---|---|
| 7,915,112 B2 | 3/2011 | Xu et al. |
| 2006/0237801 A1 | 10/2006 | Kavalieros et al. |
| 2006/0286759 A1 | 12/2006 | Xiong et al. |
| 2009/0174003 A1 | 7/2009 | Chang et al. |
| 2011/0101460 A1 | 5/2011 | Heinrich et al. |
| 2011/0195557 A1* | 8/2011 | Teo et al. .................. 438/384 |

OTHER PUBLICATIONS

Lu, C.H. et al., "Characteristics and Mechanism of Tunable Work Function Gate Electrodes Using a Bilayer Metal Structure on SiO2 and HfO2", IEEE Electron Device Letters (Jul. 2005), pp. 445-447, vol. 26, No. 7.

Bazjampv. D.I. et al., "Impact of Strain on the Surface Properties of Transition Metal Carbide Films: First-Principles Study" Journal of Applied Physics (Apr. 2010) pp. 083521-1-083521-6, vol. 107.

United States Office Action dated Jan. 5, 2015 received in U.S. Appl. No. 13/409,630.

* cited by examiner

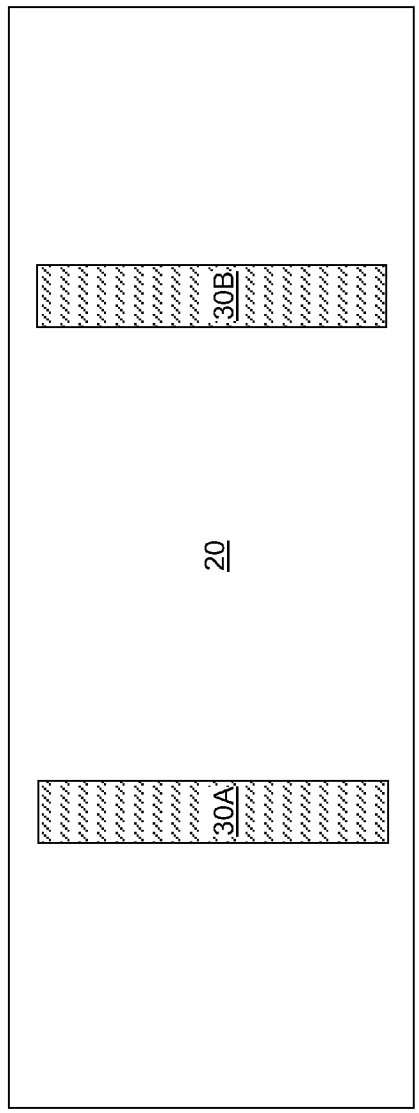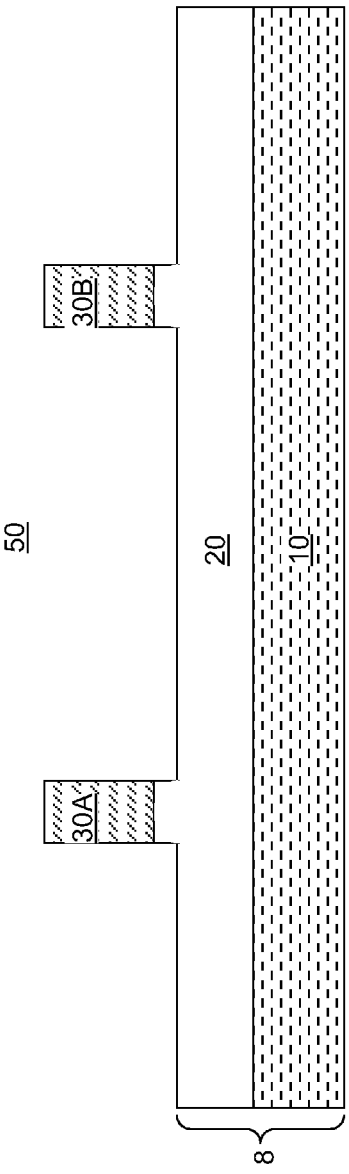

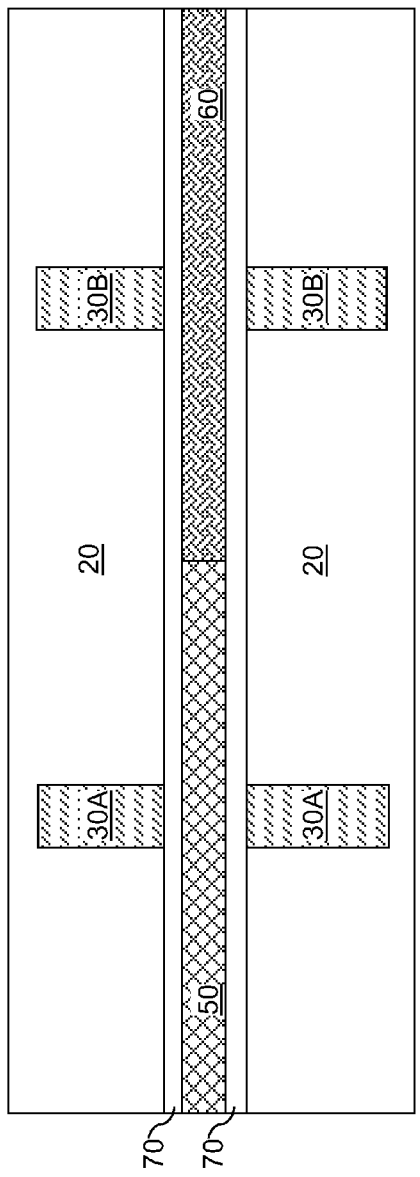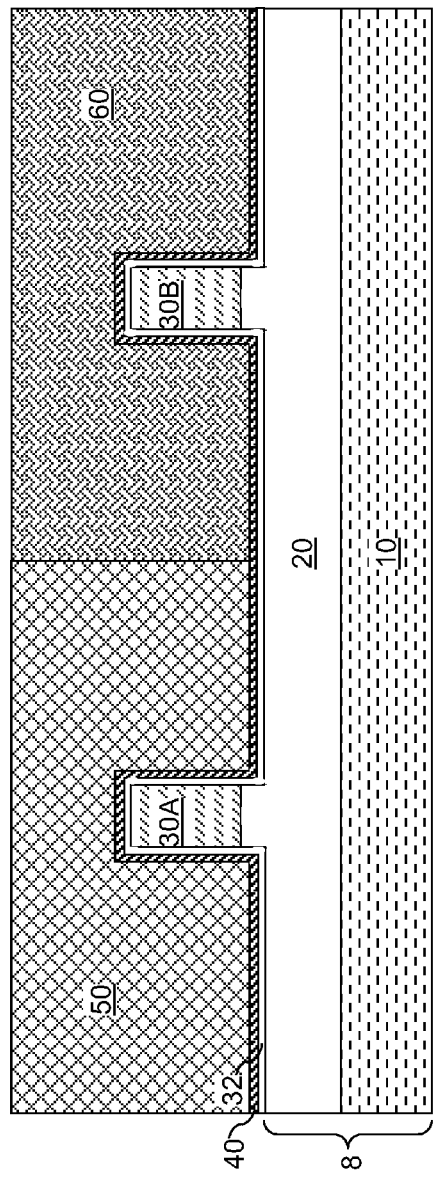

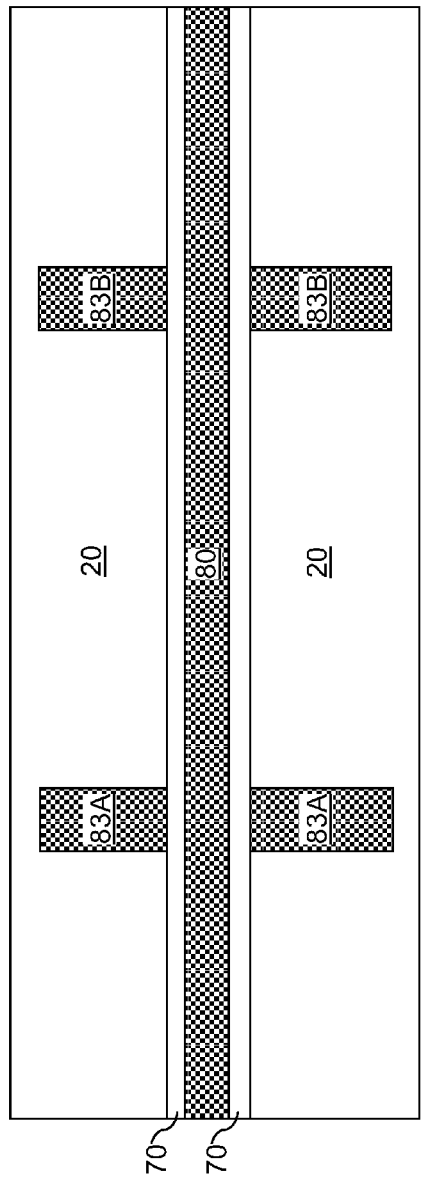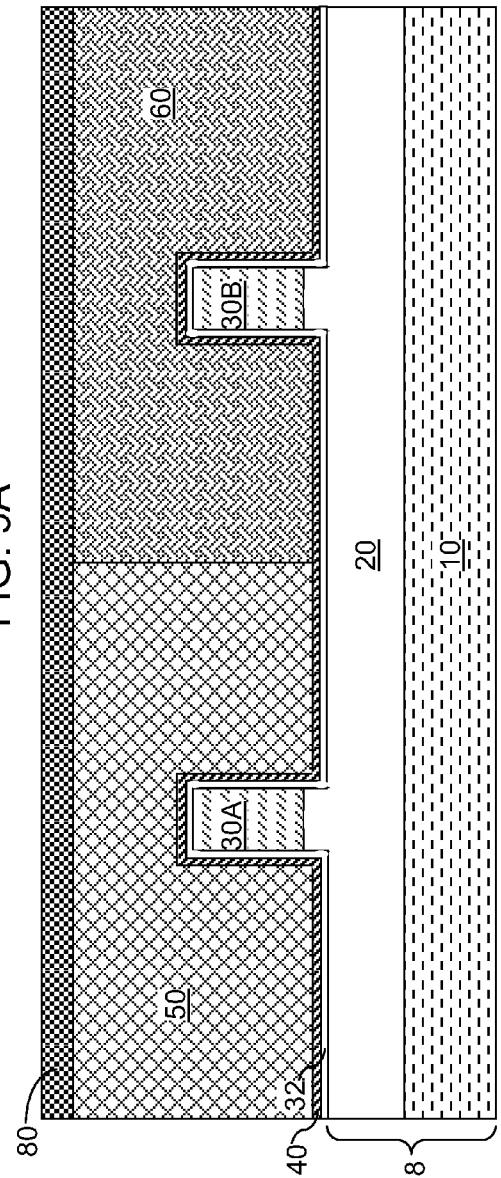

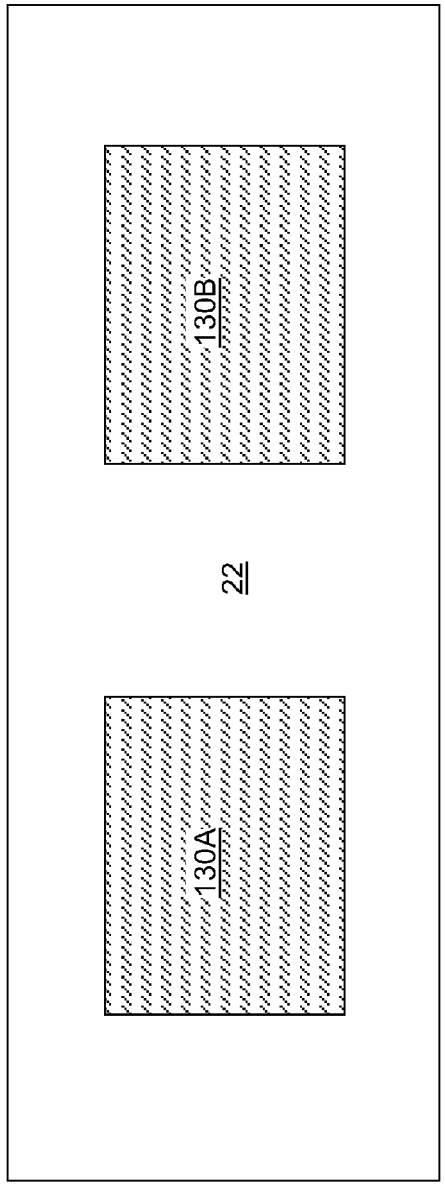
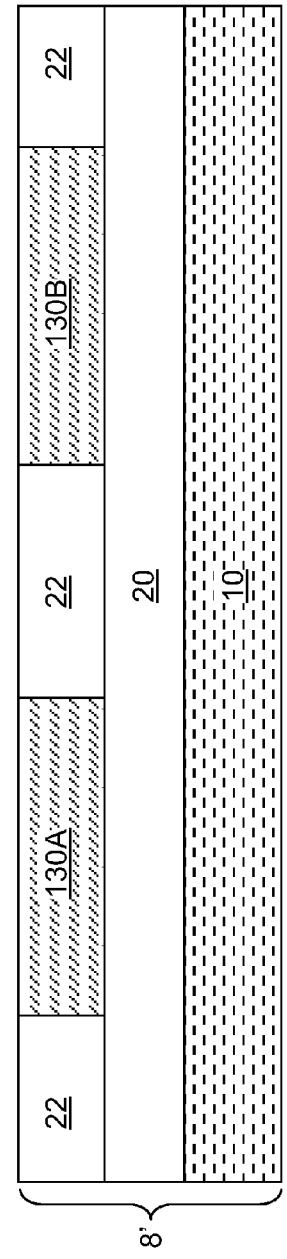
FIG. 12A
FIG. 12B

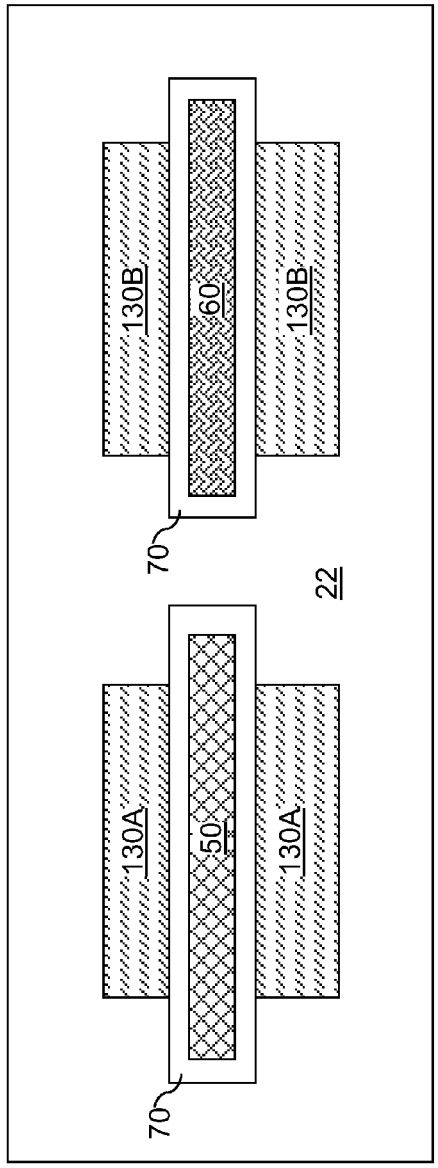
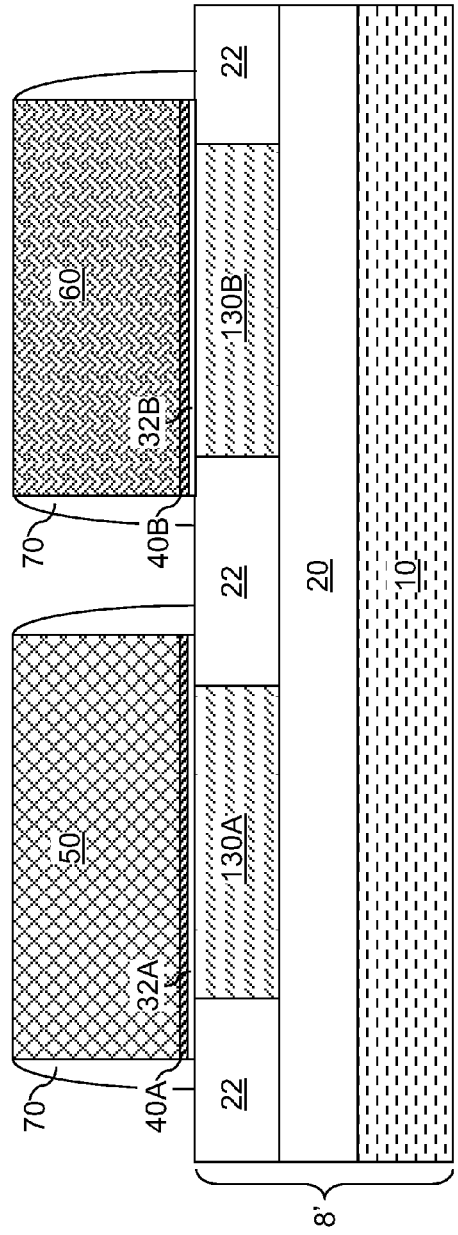
FIG. 14A
FIG. 14B

GATE STRAIN INDUCED WORK FUNCTION ENGINEERING

BACKGROUND

The present disclosure relates to a semiconductor structure and particularly to field effect transistors having workfunctions modulated by gate strain, and methods of manufacturing the same.

Metal gate field effect transistors require work function modulation in order to tune threshold voltages. Typically, p-type field effect transistors require that the workfunction of the gate electrode be near the mid-band gap or the valence band edge of the semiconductor material of the channel, and n-type field effect transistors require that the workfunction of the gate electrode be near the mid-band gap or the conduction band edge of the semiconductor material. Further, multiple threshold voltages are employed within a set of field effect transistors to provide devices tailored for various purposes. For example, some field effect transistors may be optimized for high performance, and some other field effect transistors may be optimized for low power consumption.

Workfunction modulation by introduction of dipole moments in the dielectric materials, and by altering metallic alloys is known. However, use of these techniques present problems of mobility degradation, processing temperature limitations, and cross-diffusion of gate regions with differing desired workfunction values. These problems become severe in short gate length devices such as devices having gate lengths less than 22 nm.

BRIEF SUMMARY

A stack of a gate dielectric layer and a workfunction material layer are deposited over a plurality of semiconductor material portions, which can be a plurality of semiconductor fins or a plurality of active regions in a semiconductor substrate. A first gate conductor material applying a first stress is formed on a first portion of the workfunction material layer located on a first semiconductor material portion, and a second gate conductor material applying a second stress is formed on a second portion of the workfunction material layer located on a second semiconductor material portion. The first and second stresses are different in at least one of polarity and magnitude, thereby inducing different strains in the first and second portions of the workfunction material layer. The different strains cause the workfunction shift differently in the first and second portions of the workfunction material layer, thereby providing devices having multiple different workfunctions.

According to an aspect of the present disclosure, a method of forming a semiconductor structure includes: forming a stack of a gate dielectric layer and a workfunction material layer over a first semiconductor material portion and a second semiconductor material portion; forming a first gate conductor material layer applying a first stress to a first workfunction material portion of the workfunction material layer that is located over the first semiconductor material portion, wherein the first workfunction material portion is under a first strain due to the first stress; and forming a second gate conductor material layer applying a second stress that is different from the first stress to a second workfunction material portion of the workfunction material layer that is located over the second semiconductor material portion, wherein the second workfunction material portion is under a second strain due to the second stress, and the first strain and the second strain shift workfunctions of the first and second workfunction material portions differently.

According to another aspect of the present disclosure, a method of forming a semiconductor structure includes: forming a stack of a gate dielectric layer and a workfunction material layer over a first semiconductor material portion and a second semiconductor material portion; forming a first gate conductor material layer applying a first stress to a first workfunction material portion of the workfunction material layer that is located over the first semiconductor material portion, wherein the first workfunction material portion is under a first strain due to the first stress; and forming a second gate conductor material layer applying a second stress that is different from the first stress to a second workfunction material portion of the workfunction material layer that is located over the second semiconductor material portion, wherein the second workfunction material portion is under a second strain due to the second stress, and the first strain and the second strain shift workfunctions of the first and second workfunction material portions differently, wherein the first and second strains induce volume changes of opposite polarities on the first and second workfunction metal portions.

According to yet another aspect of the present disclosure, a method of forming a semiconductor structure is provided, which includes: forming a stack of a gate dielectric layer and a workfunction material layer over first, second, third, and fourth semiconductor material portions located on a substrate; forming a first gate conductor material layer applying a first stress to a first workfunction material portion of the workfunction material layer that is located over the first and third semiconductor material portions, wherein the first workfunction material portion is under the first strain due to the first stress; forming a second gate conductor material layer applying a second stress that is different from the first stress to a second workfunction material portion of the workfunction material layer that is located over the second and fourth semiconductor material portions, wherein the second workfunction material portion is under a second strain due to the second stress; and forming source and drains for p-type field effect transistors in each of the first and second semiconductor material portions and source and drains for n-type field effect transistors in each of the third and fourth semiconductor material portions, the first strain and the second strain shift workfunctions of the first and second workfunction material portions differently.

According to even another aspect of the present disclosure, a semiconductor structure includes: a first field effect transistor including a first semiconductor material portion, a first stack of a first portion of a gate dielectric layer and a first workfunction material portion located over the first semiconductor material portion, and a first gate conductor material layer applying a first stress to the first workfunction material portion, wherein the first workfunction material portion is under a first strain due to the first stress; and a second field effect transistor including a second semiconductor material portion, a second stack of a second portion of the gate dielectric layer and a second workfunction material portion located over the second semiconductor material portion, a second gate conductor material layer applying a second stress that is different from the first stress to the second workfunction material portion, wherein the second workfunction material portion is under a second strain due to the second stress, and the first strain and the second strain shift workfunctions of the first and second workfunction material portions differently.

According to still another aspect of the present disclosure, a semiconductor structure includes: a first p-type field effect transistor (PFET), a first n-type field effect transistor (NFET), a second PFET, and a second NFET located on a substrate, wherein the first PFET and the first NFET include a first workfunction material portion overlying a channel of the first PFET and a channel of the first NFET and a first gate conductor material layer applying a first stress to the first workfunction material portion, and the second PFET and the second NFET include a second workfunction material portion overlying a channel of the second PFET and a channel of the second NFET and a second gate conductor material layer applying a second stress that is different from the first stress to the second workfunction material portion, wherein the first workfunction material portion is under a first strain due to the first stress and the second workfunction material portion is under a second strain due to the second stress, and the first and second workfunction material portions have a same composition and a same thickness, and the first strain and the second strain shift workfunctions of the first and second workfunction material portions differently.

BRIEF DESCRIPTION OF THE SEVERAL VIEWS OF THE DRAWINGS

FIG. 1A is a top-down view of a first exemplary semiconductor structure after formation of semiconductor fins according to a first embodiment of the present disclosure.

FIG. 1B is a vertical cross-sectional view of the first exemplary semiconductor structure of FIG. 1A.

FIG. 8A is a top-down view of the first exemplary semiconductor structure after formation of a gate spacer and source and drain regions according to the first embodiment of the present disclosure.

FIG. 8B is a vertical cross-sectional view of the first exemplary semiconductor structure of FIG. 8A.

FIG. 9A is a top-down view of the first exemplary semiconductor structure after formation of various metal-semiconductor alloy portions according to the first embodiment of the present disclosure.

FIG. 9B is a vertical cross-sectional view of the first exemplary semiconductor structure of FIG. 9B.

FIG. 12A is a top-down view of a third exemplary semiconductor structure after formation of a shallow trench isolation structure according to a third embodiment of the present disclosure.

FIG. 12B is a vertical cross-sectional view of the third exemplary semiconductor structure of FIG. 12B.

FIG. 14A is a top-down view of the third exemplary semiconductor structure after patterning of first and second gate electrodes and formation of gate spacers according to the third embodiment of the present disclosure.

FIG. 14B is a vertical cross-sectional view of the third exemplary semiconductor structure of FIG. 14A.

DETAILED DESCRIPTION

Figure 2A:
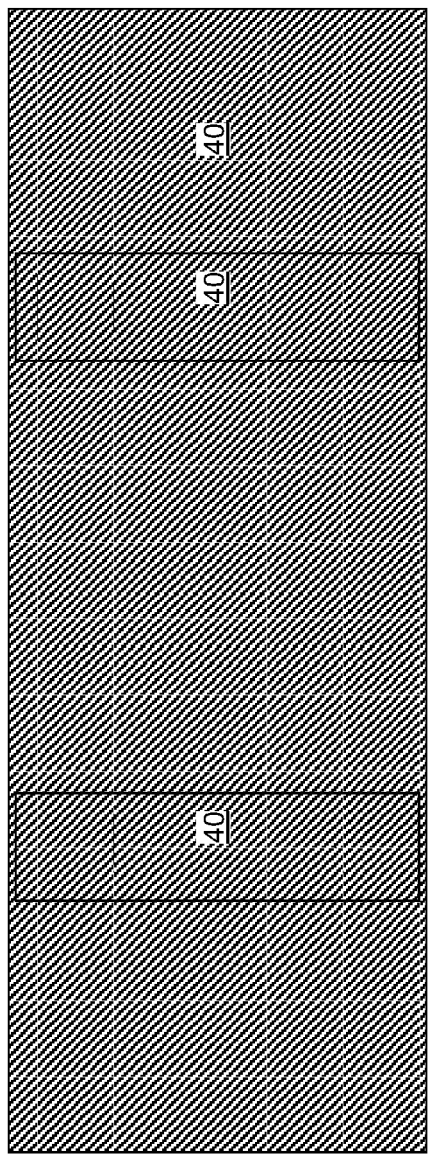
FIG. 2A is a top-down view of the first exemplary semiconductor structure after formation of a gate dielectric layer and a workfunction material layer according to the first embodiment of the present disclosure.

As stated above, the present disclosure relates to field effect transistors having workfunctions modulated by gate strain, and methods of manufacturing the same, which are now described in detail with accompanying figures. It is noted that like and corresponding elements mentioned herein and illustrated in the drawings are referred to by like reference numerals.

Referring to FIGS. 1A and 1B, a first exemplary semiconductor structure according to a first embodiment of the present disclosure includes a substrate 8 and a first semiconductor material portion 30A and a second semiconductor material portion 30B. The substrate 20 can include a stack of an insulator layer 20 and a handle substrate 10. The first semiconductor material portion 30A and the second semiconductor material portion 30B can be a pair of semiconductor fins having shapes of rectangular parallelepipeds.

In one embodiment, the first exemplary semiconductor structure can be formed by patterning a semiconductor-on-insulator (SOI) substrate that includes the handle substrate 10, the insulator layer 20 as a buried insulator layer, and a top semiconductor layer. The handle substrate 10 can include a semiconductor material, an insulator material, or a conductive material, and provides mechanical support to the buried insulator layer 20 and the top semiconductor layer 30. The insulator layer 20 comprises a dielectric material such as silicon oxide and/or silicon nitride. The thickness of the insulator layer 20 can be from 5 nm to 1000 nm, and typically from 100 nm to 200 nm. The insulator layer 20 may comprise multiple dielectric layers, e.g., silicon oxide and silicon nitride.

The top semiconductor layer includes a semiconductor material. The thickness of the top semiconductor layer is sufficient to form semiconductor fins therefrom. For example, the top semiconductor layer can have a thickness from 5 nm to 500 nm, and typically from 10 nm to 55 nm, although lesser and greater thicknesses can also be employed. In one embodiment, the top semiconductor layer includes a single crystalline semiconductor material. The semiconductor material of the top semiconductor layer can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The first semiconductor material portion 30A and the second semiconductor material portion 30B, which can be a first semiconductor fin and a second semiconductor fin, respectively, can be formed by patterning the top semiconductor layer by a combination of lithographic methods and a pattern transfer etch. Top pedestal portions of the insulator layer 20 can be formed underneath the first and second semiconductor material portions (30A, 30B) due to an overetch of the top semiconductor layer into the insulator layer 20 during the formation of the first and second semiconductor material portions (30A, 30B).

Figure 2B:
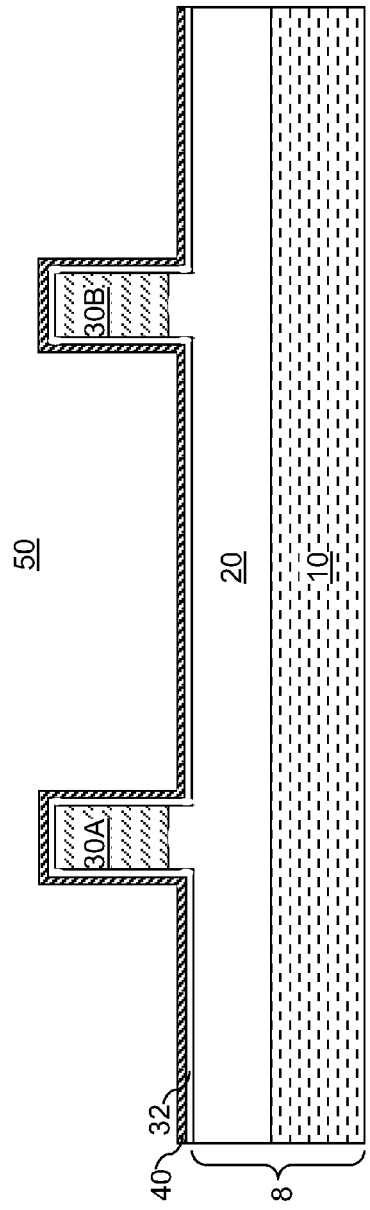
FIG. 2B is a vertical cross-sectional view of the first exemplary semiconductor structure of FIG. 2A.

Referring to FIGS. 2A and 2B, a gate dielectric layer 32 is formed on the physically exposed surfaces of the first and second semiconductor material portions (30A, 30B) and optionally, on the top surface of the insulator layer 20. The thickness of the gate dielectric layer 32 can be from 1.0 nm to 6.0 nm, although lesser and greater thicknesses can also be employed.

In one embodiment, the gate dielectric layer 32 can be formed by thermal conversion or plasma conversion of surface portions of the first and second semiconductor material portions (30A, 30B) into a dielectric semiconductor oxide material, a dielectric semiconductor nitride material, or a dielectric semiconductor oxynitride material. For example, the gate dielectric layer 32 can include silicon oxide, silicon nitride, or silicon oxynitride.

In another embodiment, the gate dielectric layer 32 can be formed by deposition, for example, by chemical vapor deposition or atomic layer deposition, of a dielectric material. The dielectric material can include a dielectric semiconductor oxide, a dielectric semiconductor nitride, a dielectric semiconductor oxynitride, or a dielectric metal oxide material. The dielectric metal oxide material can have a dielectric constant greater than 8.0. The gate dielectric layer 32 can include a stack of a dielectric material formed by thermal conversion or plasma conversion of a semiconductor material and a dielectric metal oxide layer.

A workfunction material layer 40 is deposited on the top surfaces and outside surfaces of the gate dielectric layer 32. The workfunction material layer 40 includes a metallic material. In one embodiment, the metallic material in the workfunction material layer 40 has an unstrained-state workfunction, i.e., the workfunction in an unstrained state, in a range between the valence band of the semiconductor material of the first and second semiconductor material portions (30A, 30B) and the conduction band of the semiconductor material of the first and second semiconductor material portions (30A, 30B). For example, the first and second semiconductor material portions (30A, 30B) can include silicon, and the metallic material in the workfunction material layer 40 can have an unstrained-state workfunction in a range between the silicon valence band and the silicon conduction band.

The metallic material of the workfunction material layer 40 is selected so that the workfunction of the metallic material depends on the strain of the metallic material. In one embodiment, the workfunction of the metallic material of the workfunction material layer 40 can increase with a positive strain, i.e., a tensile strain that has a net effect of increasing the total volume of the metallic material. Further, the workfunction of the metallic material of the workfunction material layer 40 can decrease with a negative strain, i.e., a compressive strain that has a net effect of decreasing the total volume of the metallic material. Metallic materials having a workfunction that increases with a positive strain and decreases with a negative strain, i.e., having a workfunction that shifts farther away from the vacuum level with a positive strain and closer to the vacuum level with a negative strain, include, but are not limited to, TiC having a predominantly (001) crystallographic orientation along the direction of the thickness, TiN having a predominantly (001) crystallographic orientation along the direction of the thickness, TaC having a predominantly (001) crystallographic orientation along the direction of the thickness, and TaN having a predominantly (001) crystallographic orientation along the direction of the thickness.

The direction of thickness of the workfunction material layer 40 refers to the direction perpendicular to a local interface between the gate dielectric layer 32 and the workfunction material layer 40. Thus, the direction of the thickness of the workfunction material layer 40 is a vertical direction on the top surfaces of the first and second semiconductor material portions (30A, 30B) and over the horizontal surface of the dielectric layer 20 that does not underlie the first and second semiconductor material portions (30A, 30B), and is a horizontal direction perpendicular to sidewalls of the first and second semiconductor material portions (30A, 30B) at the sidewalls of the first and second semiconductor material portions (30A, 30B).

In another embodiment, the workfunction of the metallic material of the workfunction material layer 40 can decrease with a positive strain. Further, the workfunction of the metallic material of the workfunction material layer 40 can increase with a negative strain. Metallic materials having a workfunction that decreases with a positive strain and increases with a negative strain, i.e., having a workfunction that shifts closer to the vacuum level with a positive strain and farther away from the vacuum level with a negative strain, include, but are not limited to, TiC having a predominantly (111) crystallographic orientation along the direction of the thickness, TiN having a predominantly (111) crystallographic orientation along the direction of the thickness, TaC having a predominantly (111) crystallographic orientation along the direction of the thickness, and TaN having a predominantly (111) crystallographic orientation along the direction of the thickness.

The workfunction material layer 40 can be formed, for example, by physical vapor deposition (PVD), atomic layer deposition (ALD), and/or chemical vapor deposition (CVD). The thickness of the workfunction material layer 40 can be from 1.0 nm to 20 nm, although lesser and greater thicknesses can also be employed. Thus, a stack of the gate dielectric layer 32 and the workfunction material layer 40 is formed on the surfaces of the first and second semiconductor material portions (30A, 30B).

Figure 3A:
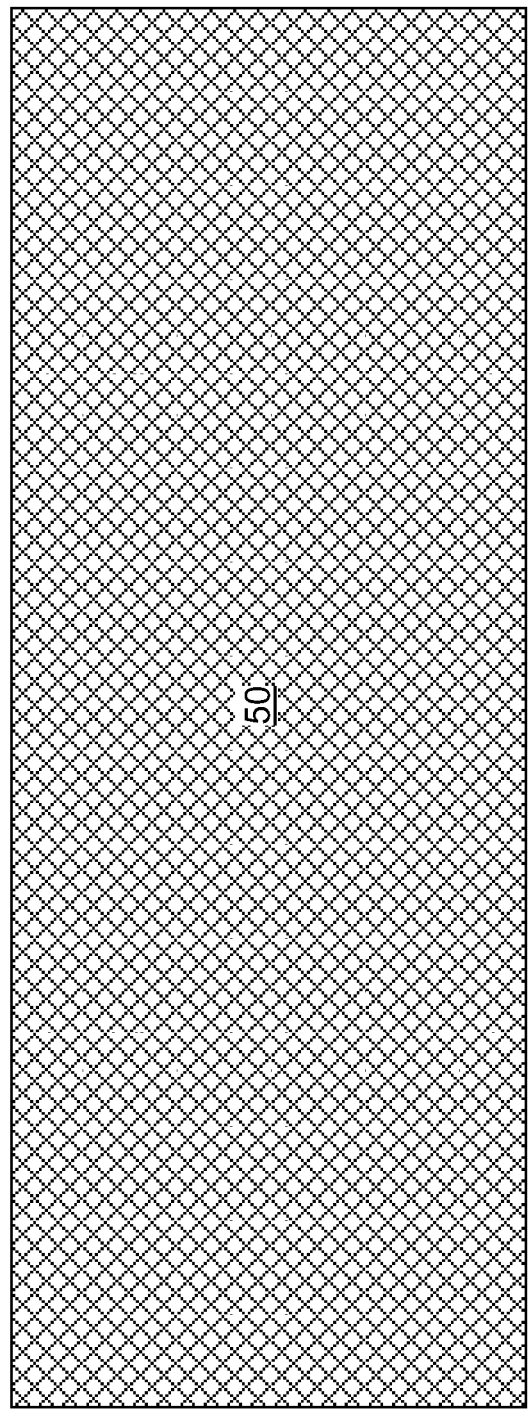
FIG. 3A is a top-down view of the first exemplary semiconductor structure after formation of a first gate conductor material layer according to the first embodiment of the present disclosure.
Figure 3B:
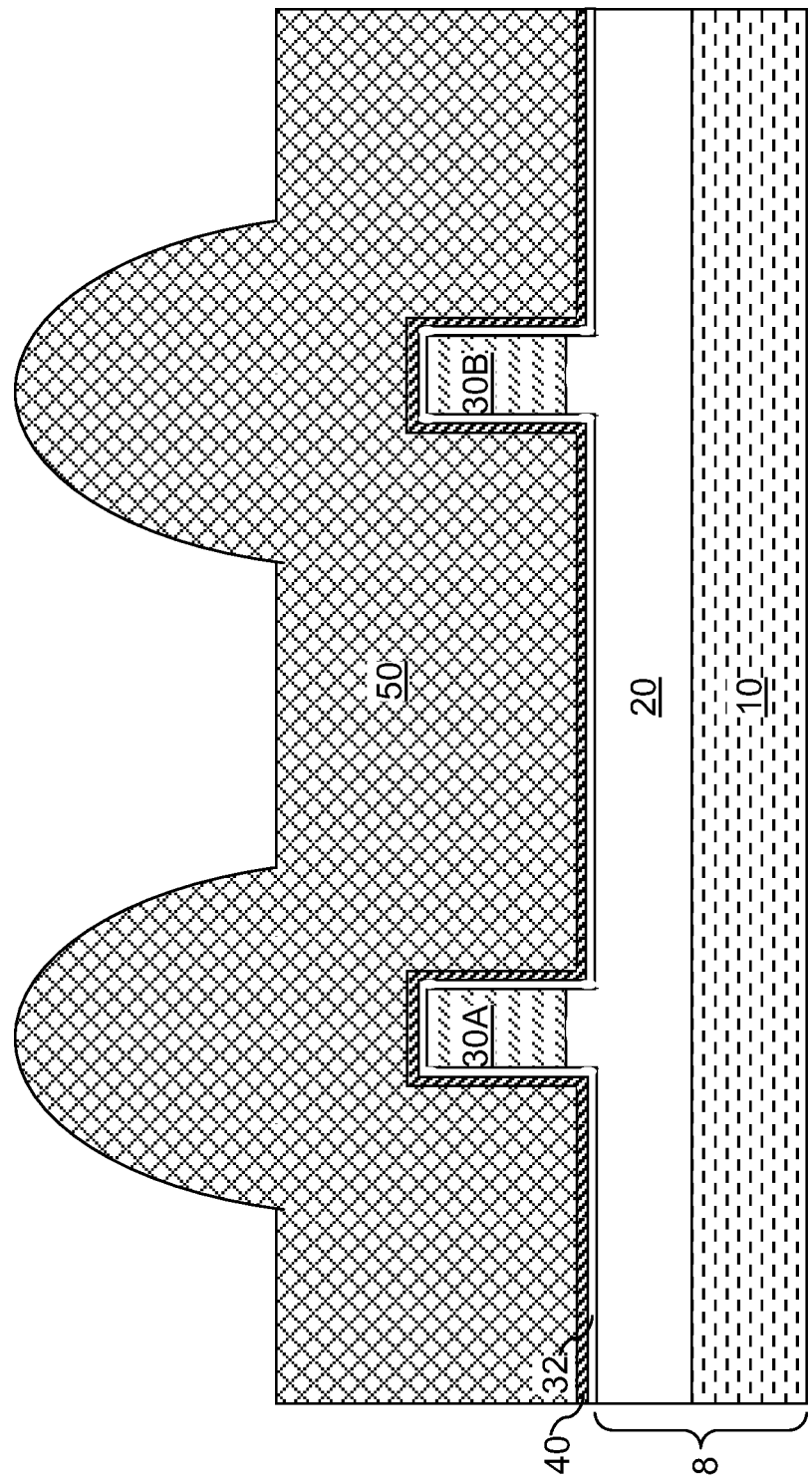
FIG. 3B is a vertical cross-sectional view of the first exemplary semiconductor structure of FIG. 3A.

Referring to FIGS. 3A and 3B, a first gate conductor material layer 50 is deposited over the first and second semiconductor material portions (30A, 30B). The first gate conductor material layer 50 can be deposited, for example, by chemical vapor deposition (CVD), atomic layer deposition (ALD), and/or physical vapor deposition (PVD). The first gate conductor material layer 50 is a stress-generating material layer that generates and applies a first stress to the workfunction material layer 40 located underneath. The workfunction material layer 40 is under a strain, which is herein referred to as a first strain, due to the first stress. The first stress can be a compressive stress or a tensile stress. Correspondingly, the first strain can be a compressive strain or a tensile strain.

In one embodiment, the first gate conductor material layer 50 can include at least one semiconductor material, which can be an elemental semiconductor material such as silicon or germanium or a compound semiconductor material. Further, the at least one semiconductor material of the first gate conductor material layer 50 can be doped with a dopant, which is an element having an atomic size different from the average atomic size of the at least one semiconductor material. The dopant in the first gate conductor material layer 50 alters the lattice constant in the grains of the polycrystalline structure of the first gate conductor material layer 50, and causes the first gate conductor material layer 50 to have a built-in tensile stress or a built-in compressive stress. The built-in stress of the first gate conductor material layer 50 is applied to the workfunction material layer 40 as the first stress, which induces the first strain in the workfunction material layer 40.

In one embodiment, the first gate conductor material layer 50 includes at least one elemental semiconductor material, which can include at least one of silicon and germanium. The dopant in the first gate conductor material layer 50 can be an electrical dopant, such as a p-type dopant or an n-type dopant, or a non-electrical dopant. P-type dopants include, for example, B, Ga, and In. N-type dopants include, for example, P, As, and Sb. Non-electrical dopants include C, Si, and Ge.

In one embodiment, the first gate conductor material layer 50 can include a metallic material. In one embodiment, the metallic material of the first gate conductor material layer 50 can be different from the material of the workfunction material layer 40. For example, the first gate conductor material layer 50 can include a material selected from Al, Ta, Ti, W, TaN, TiN, and WN. In another embodiment, the metallic material of the first gate conductor material layer 50 can be the same as the material of the workfunction material layer 40.

Figure 4A:
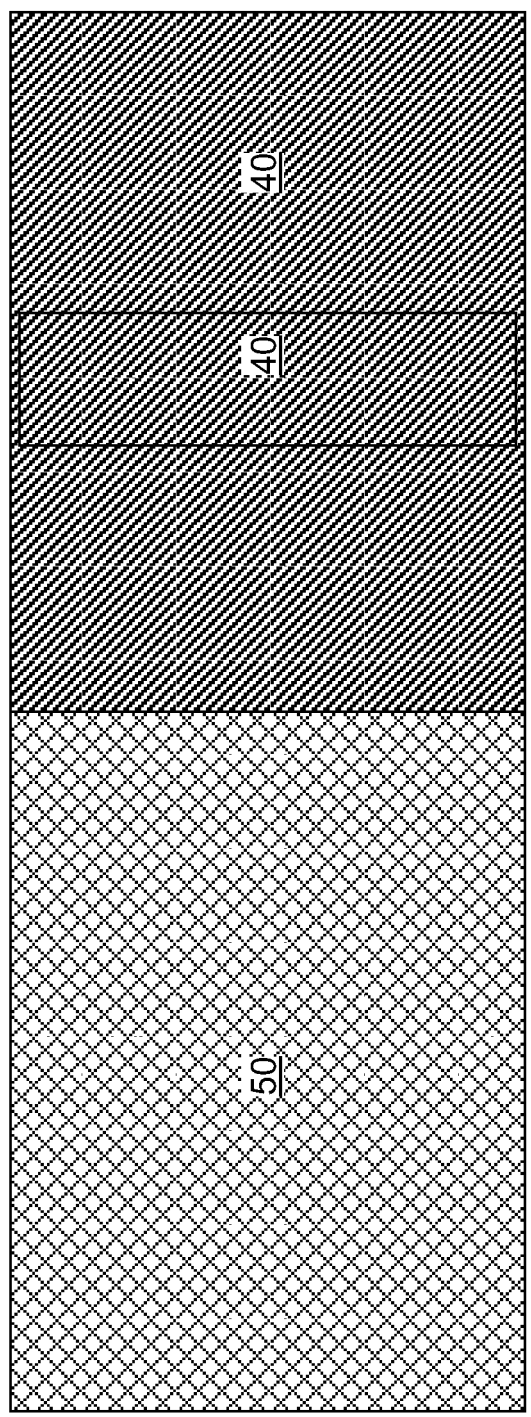
FIG. 4A is a top-down view of the first exemplary semiconductor structure after patterning of the first gate conductor material layer according to the first embodiment of the present disclosure.
Figure 4B:
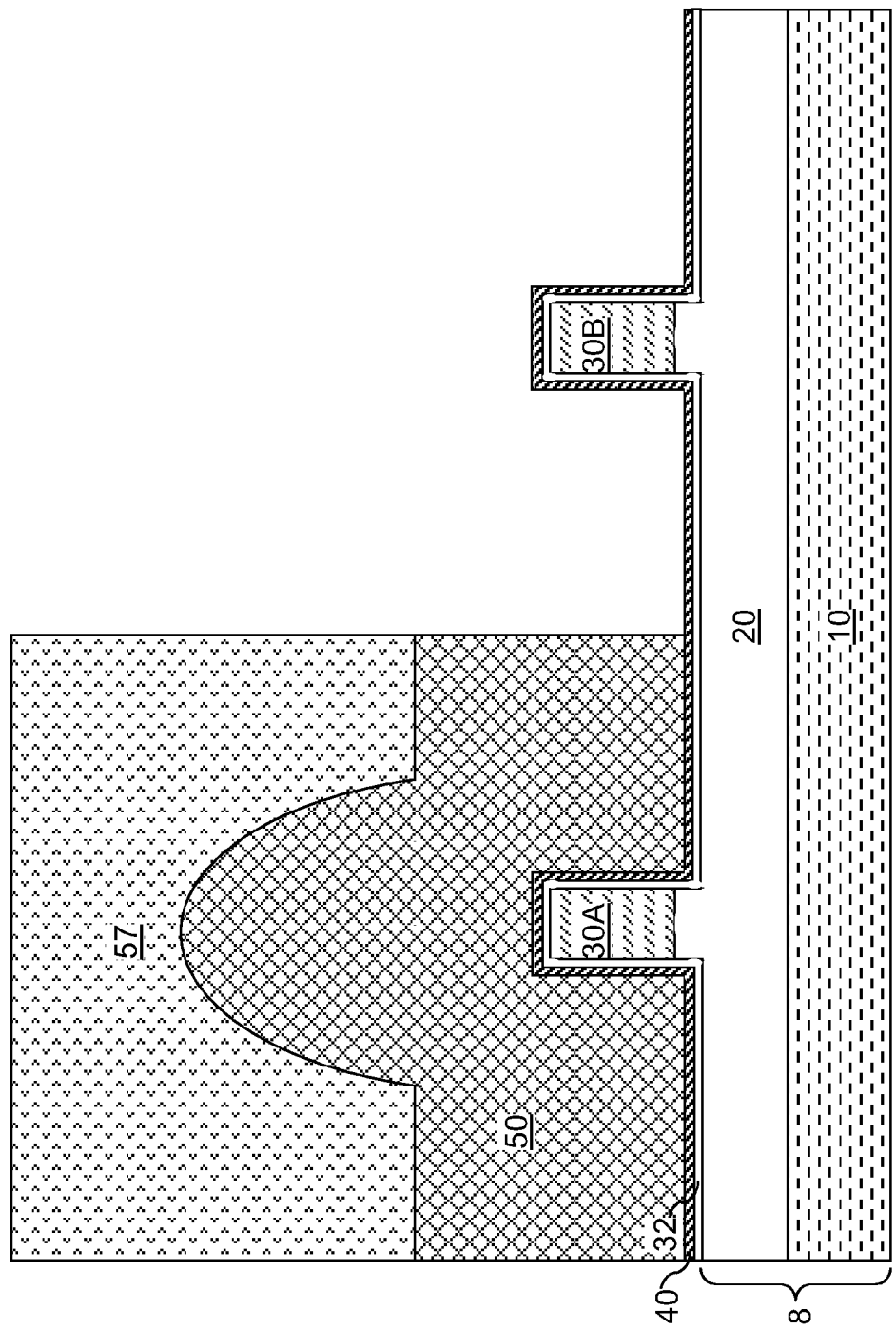
FIG. 4B is a vertical cross-sectional view of the first exemplary semiconductor structure of FIG. 4A.

Referring to FIGS. 4A and 4B, the first gate conductor material layer 50 is patterned so that a remaining portion of the first gate conductor material layer 50 is present over the first semiconductor material portion 30A, and is removed from above the second semiconductor material portion 30B. Specifically, a photoresist layer 57 is applied over the first gate conductor material layer 50 and is lithographically patterned so that a remaining portion of the photoresist layer 57 after development is present in a region including the first semiconductor material portion 30A, and is not present in a region including the second semiconductor material portion 30B. The pattern in the photoresist layer 57 is transferred into the first gate conductor material layer 50 by an etch, which can be, for example, an anisotropic etch such as a reactive ion etch. The etch can be selective to the metallic material of the workfunction material layer 40. The photoresist layer 50 is subsequently removed, for example, by ashing.

Figure 5A:
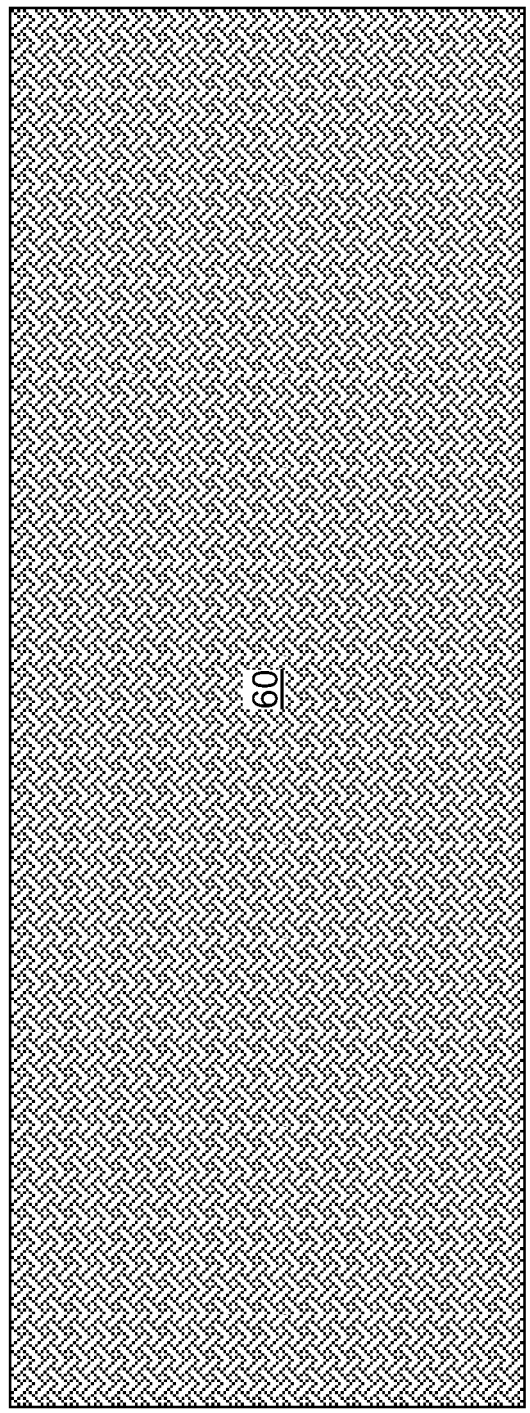
FIG. 5A is a top-down view of the first exemplary semiconductor structure after formation of a second gate conductor material layer according to the first embodiment of the present disclosure.
Figure 5B:
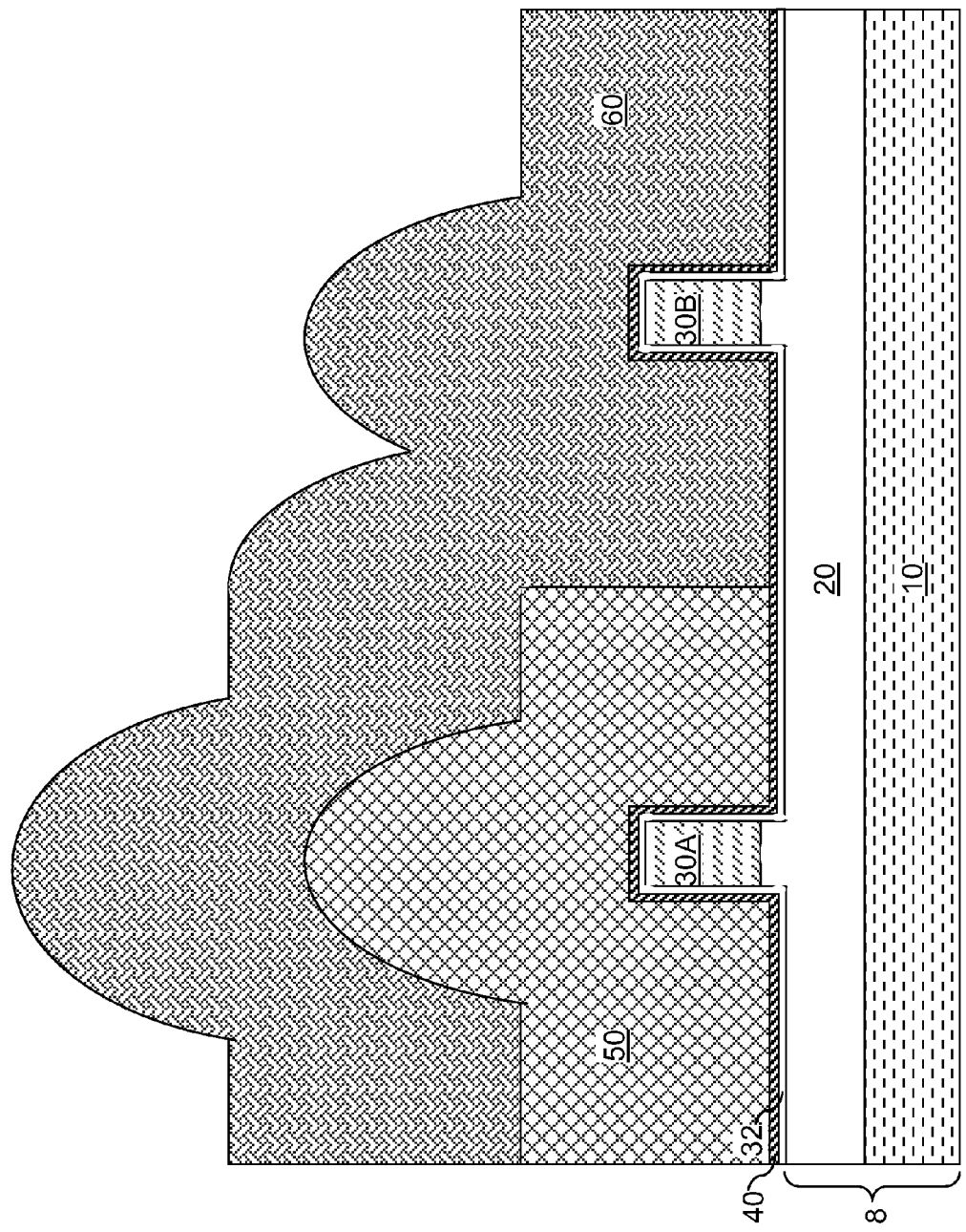
FIG. 5B is a vertical cross-sectional view of the first exemplary semiconductor structure of FIG. 5A.

Referring to FIGS. 5A and 5B, a second gate conductor material layer 60 is deposited over the remaining portion of the first gate conductor material layer 50 and over the physically exposed portions of the workfunction material layer 40. The second gate conductor material layer 60 can be deposited, for example, by chemical vapor deposition (CVD), atomic layer deposition (ALD), and/or physical vapor deposition (PVD). The second gate conductor material layer 60 is a stress-generating material layer that generates and applies a second stress to the workfunction material layer 40 located underneath. The second stress is different from the first stress in magnitude, in polarity, or in magnitude and polarity. The portion of the workfunction material layer 40 in contact with the second gate conductor material layer 60 is under a strain, which is herein referred to as a second strain, due to the second stress. The second stress can be a compressive stress or a tensile stress. Correspondingly, the second strain can be a compressive strain or a tensile strain.

In one embodiment, the second gate conductor material layer 60 includes at least one semiconductor material, which can be an elemental semiconductor material such as silicon or germanium or a compound semiconductor material. In this case, the first gate conductor material layer 50 can include a semiconductor material or a metallic material. The at least one semiconductor material of the second gate conductor material layer 60 can be doped with a dopant, which is an element having an atomic size different from the average atomic size of the at least one semiconductor material of the second gate conductor material layer 60. The dopant in the second gate conductor material layer 60 alters the lattice constant in the grains of the polycrystalline structure of the second gate conductor material layer 60, and causes the second gate conductor material layer 60 to have a built-in tensile stress or a built-in compressive stress, which is different from the built-in stress in the first gate conductor material layer 50 by magnitude, by polarity, or by magnitude and polarity. The built-in stress of the second gate conductor material layer 60 is applied to the portion of the workfunction material layer 40 in direct contact with the second gate conductor material layer 60 as the second stress, which induces the second strain in the portion of the workfunction material layer 40 in direct contact with the second gate conductor material layer 60.

In one embodiment, the second gate conductor material layer 60 can include at least one semiconductor material, which can be at least one elemental semiconductor material such as silicon and germanium, or at least one compound semiconductor material. The dopant in the second gate conductor material layer 60 can be an electrical dopant, such as a p-type dopant or an n-type dopant, or a non-electrical dopant. In this case, the first gate conductor material layer 50 can include a semiconductor material or a metallic material. If the first gate conductor material layer 50 includes at least one elemental semiconductor material and a first dopant, and the second gate conductor material layer 60 includes at least another elemental semiconductor material and a second dopant, the compositions of the first and second gate conductor material layers (50, 60) are different from each other. For example, the first and second gate conductor material layers (50, 60) can include different elemental semiconductor materials and/or the first and second dopants can be different elements.

In one embodiment, the second gate conductor material layer 60 can include a metallic material. In this case, the first gate conductor material layer 50 can include a semiconductor material or a metallic material. In one embodiment, the metallic material of the second gate conductor material layer 60 can be different from the material of the workfunction material layer 40. For example, the second gate conductor material layer 50 can include a material selected from Al, Ta, Ti, W, TaN, TiN, and WN. In another embodiment, the metallic material of the second gate conductor material layer 60 can be the same as the material of the workfunction material layer 40. If the first and second gate conductor material layers (50, 60) include metallic materials, the metallic material of the first gate conductor material layer 50 is different from the metallic material of the second gate conductor material layer.

The second gate conductor material layer 60 applies a second stress that is different from the first stress to a portion of the workfunction material layer 40 in contact with the second gate conductor material layer 60, which is herein referred to as a second workfunction material portion. The second gate workfunction material portion is located over the second semiconductor material portion 30B, and is under the second strain due to the second stress. The portion of the workfunction material layer 40 that is in contact with the first gate conductor material layer 50 is herein referred to as a first workfunction material portion.

The first strain and the second strain shift workfunctions of the first and second workfunction material portions differently. In one embodiment, one of the first and second stress is compressive, and the other of the first and second stress is tensile. Thus, the first and second strains induce volume changes of opposite polarities on the first and second workfunction metal portions of the workfunction material layer 40.

In one embodiment, one of the first and second gate conductor material layers (50, 60) includes at least one semiconductor material, and is doped with a first element having an atomic size greater than an average atomic size of the at least one semiconductor material, and the other of the first and second gate conductor material layers (50, 60) includes the at least one semiconductor material, and is doped with a second element having an atomic size smaller than the average atomic size of the at least one semiconductor material. In one embodiment, the at least one elemental semiconductor material can include at least one of silicon and germanium. In one embodiment, the first element can be selected from B, Ga, In, and Ge, and the second element can be selected from P, As, Sb, and C.

In one embodiment, one of the first and second gate conductor material layers (50, 60) can include a first metallic material, and the other of the first and second gate conductor material layers can include a second metallic material different from the first metallic material. In one embodiment, each of the first and second gate conductor material layers can include a material selected from Al, Ta, Ti, W, TaN, TiN, and WN.

In one embodiment, one of the first and second gate conductor material layers (50, 60) can include a metallic material, and the other of the first and second gate conductor material layers (50, 60) can include a semiconductor material.

In one embodiment, both of the first and second strains can induce net volume changes of a same polarity, which can be positive or negative, and of different magnitudes on the first and second workfunction metal portions of the workfunction material layer 40.

Figure 6A:
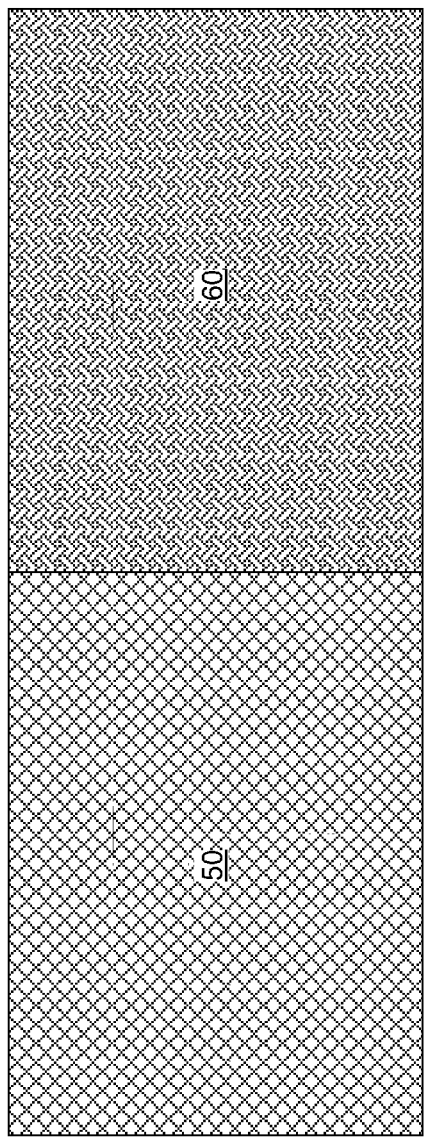
FIG. 6A is a top-down view of the first exemplary semiconductor structure after planarization of the first and second gate conductor material layers according to the first embodiment of the present disclosure.
Figure 6B:
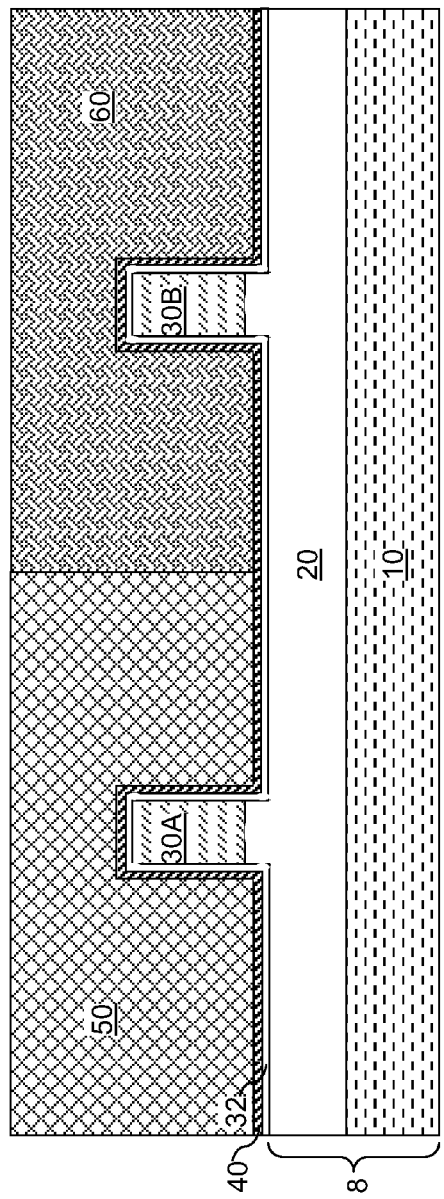
FIG. 6B is a vertical cross-sectional view of the first exemplary semiconductor structure of FIG. 6A.

Referring to FIGS. 6A and 6B, the first and second gate conductor material layers (50, 60) are planarized, for example, by chemical mechanical planarization (CMP). Portions of the first and second gate conductor material layers (50, 60) that are above a horizontal plane, which is located above topmost surfaces of the workfunction material layer 40, are removed during the planarization. The thickness of the remaining portions of the first and second gate conductor material layers (50, 60), as measured above the topmost surfaces of the workfunction material layer 40, can be from 10 nm to 300 nm, although lesser and greater thicknesses can also be employed. The entirety of the top surface of the first and second gate conductor material layers (50, 60) can be coplanar, i.e., located within a single horizontal plane, after the planarization. The first gate conductor material layer 50 is present over the first semiconductor material portion 30A and the first workfunction material portion that is in contact with the first conductor material layer 50, and the second gate conductor material layer 60 is present over the second semiconductor material portion 30B and the second workfunction material portion that is in contact with the second conductor material layer 60.

Figure 7A:
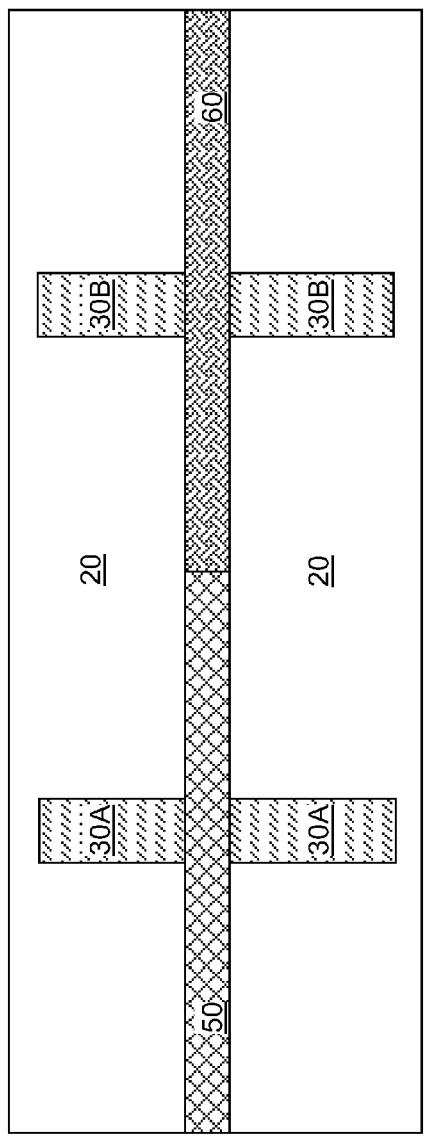
FIG. 7A is a top-down view of the first exemplary semiconductor structure after patterning of gate electrodes according to the first embodiment of the present disclosure.
Figure 7B:
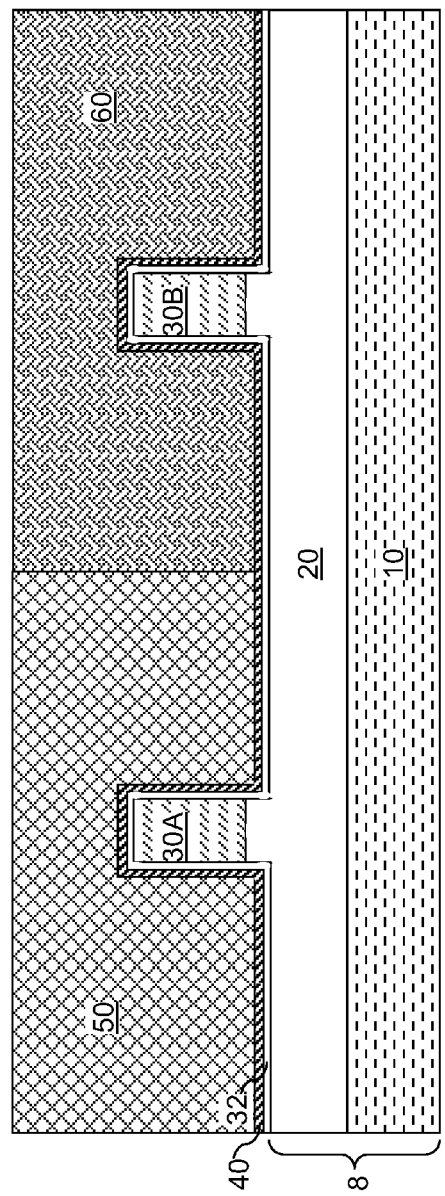
FIG. 7B is a vertical cross-sectional view of the first exemplary semiconductor structure of FIG. 7A.

Referring to FIGS. 7A and 7B, the first and second gate conductor material layers (50, 60) and the workfunction material layer 40 are lithographically patterned to form gate electrodes. For example, a first gate electrode formed over the first semiconductor material portion 30A includes a remaining portion of the first gate conductor material layer 50 and a remaining portion of the first workfunction material portion of the workfunction material layer 40, and a second gate electrode formed over the second semiconductor material portion 30B includes a remaining portion of the second gate conductor material layer 60 and a remaining portion of the second workfunction material portion of the workfunction material layer 40. As discussed above, the first gate conductor material layer 50 in the first gate electrode applies the first stress to, and induces the first strain in, the first workfunction material portion of the workfunction material layer 40, and the second gate conductor material layer 60 in the second gate electrode applies the second stress to, and induces the second strain in, the second workfunction material portion of the workfunction material layer 40. Thus, the workfunctions of the first and second workfunction material portions of the workfunction material layer 40 are shifted differently from the workfunction at an unstrained state. The gate dielectric layer 32 may, or may not, be patterned.

Referring to FIGS. 8A and 8B, various source/drain extension implantation and halo implantations can be performed employing masked ion implantation processes to form source/drain extension regions (not explicitly marked in drawings) and/or halo implantation regions (not explicitly marked). A gate spacer 70 can be formed around the first and second gate electrodes (40, 50, 60), for example, by depositing a conformal dielectric material layer and anisotropically removing horizontal portions of the conformal dielectric material layer. Various source/drain implantation can be performed employing masked ion implantation processes to form source/drain regions (not explicitly marked).

Referring to FIGS. 9A and 9B, various metal semiconductor alloy portions can be formed, for example, by depositing a metal layer on various semiconductor material portions and inducing formation of a metal semiconductor alloy such as a metal silicide, a metal germanide, and/or a metal germanosilicide. For example, first source/drain metal semiconductor alloy portions 83A can be formed on top surfaces and/or sidewall surfaces of the first semiconductor material portion 30A, which includes a source region, a drain region, and a body region of a first field effect transistor, and second source/drain metal semiconductor alloy portions 83B can be formed on top surfaces and/or sidewall surfaces of the second semiconductor material portion 30B, which includes a source region, a drain region, and a body region of a second field effect transistor. If the first gate conductor material layer 50 and/or the second gate conductor material layer 60 includes a semiconductor material, a gate-side metal semiconductor alloy portion 80 can be formed on the semiconductor material(s) of the first gate conductor material layer 50 and/or the second gate conductor material layer 60.

The first field effect transistor includes the first semiconductor material portion 30A, a first stack of a first portion of a gate dielectric layer 32 and the first workfunction material portion of the workfunction material layer 40 located over the first semiconductor material portion 30A, and the first gate conductor material layer 50 applying the first stress to the first workfunction material portion. The first workfunction material portion is under the first strain due to the first stress. The second field effect transistor includes the second semiconductor material portion 30B, a second stack of a second portion of the gate dielectric layer 32 and the second workfunction material portion of the workfunction material layer 40 located over the second semiconductor material portion 30B, the second gate conductor material layer 60 applying the second stress that is different from the first stress to the second workfunction material portion. The second workfunction material portion is under the second strain due to the second stress. The first strain and the second strain shift workfunctions of the first and second workfunction material portions differently in magnitude, in polarity, or in magnitude and polarity. The first field effect transistor and the second field effect transistors can be of the same polarity, i.e., two p-type transistors or two n-type transistors, or can be of the opposite polarities, i.e., a p-type field effect transistor and an n-type field effect transistor.

Figure 10A:
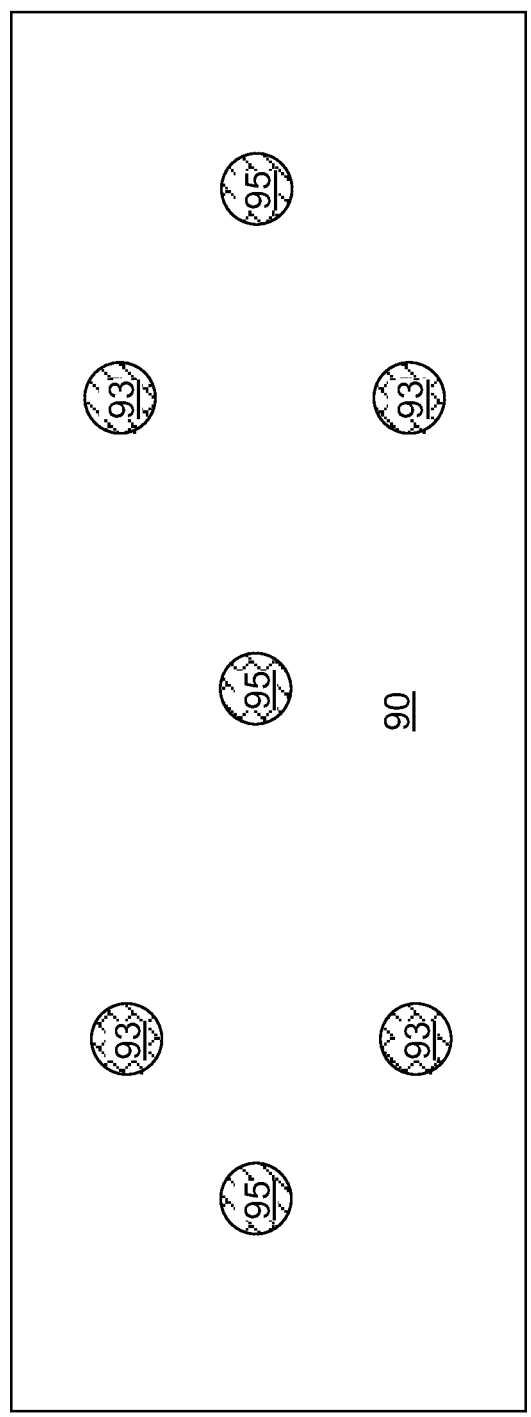
FIG. 10A is a top-down view of the first exemplary semiconductor structure after formation of a contact-level dielectric layer and various contact via structures according to the first embodiment of the present disclosure.
Figure 10B:
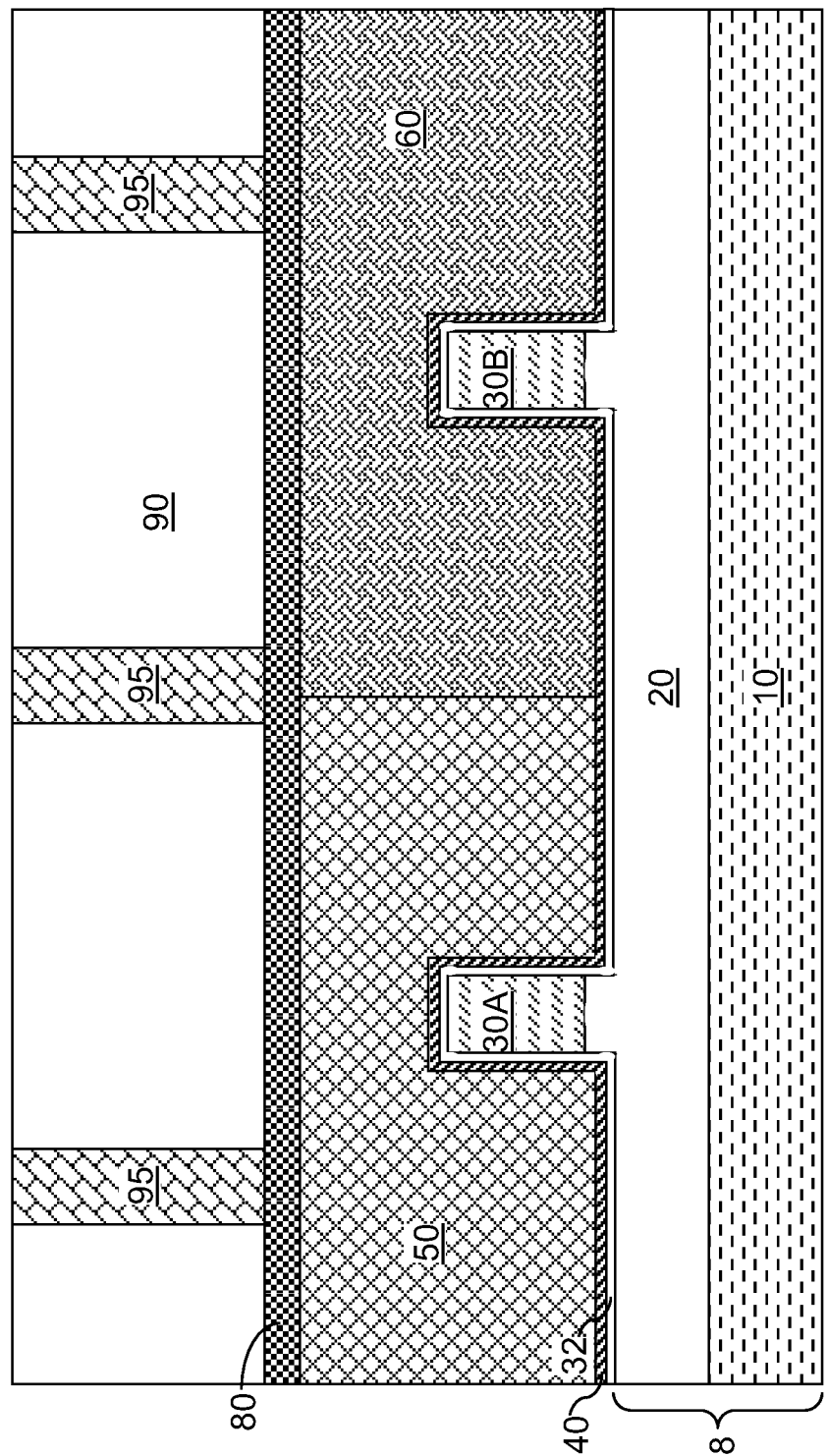
FIG. 10B is a vertical cross-sectional view of the first exemplary semiconductor structure of FIG. 10A.

Referring to FIGS. 10A and 10B, a contact-level dielectric layer 90 is deposited over the first gate conductor material layer 50 and/or the second gate conductor material layer 60 and the first and second semiconductor material portions (30A, 30B). The contact-level dielectric layer 90 can be planarized, for example, by chemical mechanical planarization. Various contact via structures can be formed, for example, by forming contact via holes in the contact-level dielectric layer 90 and filling the contact via holes with a conductive material. The various contact via structures can include, for example, gate contact via structures 95 and source/drain contact via structures 93.

Figure 11:
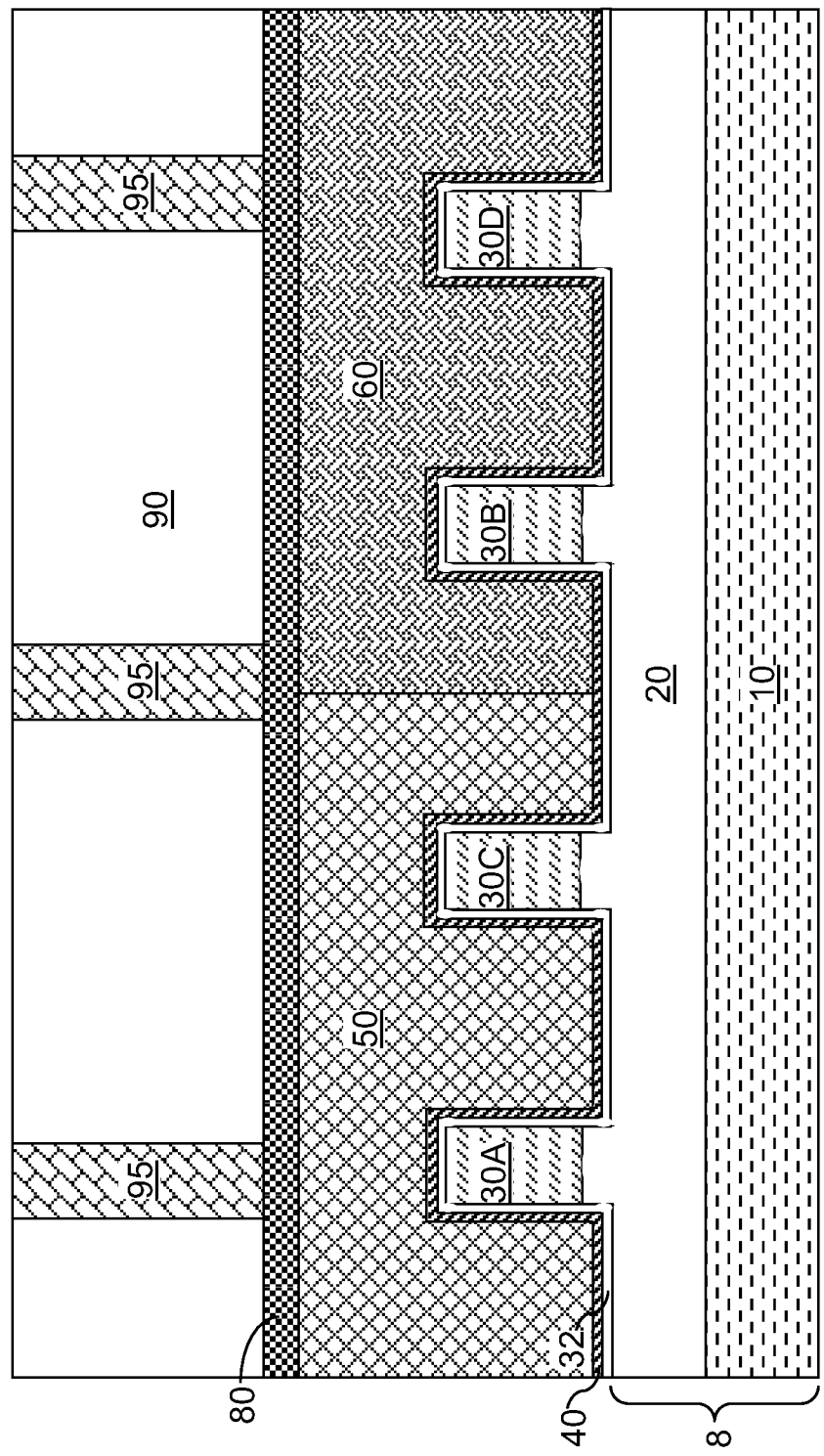
FIG. 11 is a vertical cross-sectional view of a second exemplary semiconductor structure according to a second embodiment of the present disclosure.

Referring to FIG. 11, a second exemplary semiconductor structure according to a second embodiment of the present disclosure can be derived from the first exemplary semiconductor structure by forming a first plurality of semiconductor material fins, such as semiconductor fins, in a first area in which the first gate conductor layer 50 contacts the workfunction material layer 40 (See FIGS. 6A and 6B), and by forming a second plurality of semiconductor material portions, such as semiconductor fins, in a second area in which the second gate conductor layer 60 contacts the workfunction material layer 40 (See FIGS. 6A and 6B).

For example, a first semiconductor material portion 30A, a second semiconductor material portion 30B, a third semiconductor material portion 30C, and a fourth semiconductor material portion 30D are formed over an insulator layer 20 in a substrate (10, 20). A stack of the gate dielectric layer 32 and the workfunction material layer 40 is formed over the first, second, third, and fourth semiconductor material portions (30A, 30B, 30C, 30D). The first gate conductor material layer 50 is formed and planarized employing the same processing steps as in the first embodiment such that the first gate conductor material layer 50 applies the first stress to the first workfunction material portion of the workfunction material layer 40 that is located over the first and third semiconductor material portions (30A, 30C). The first and third workfunction material portions are under a first strain due to the first stress. The second gate conductor material layer 60 is formed and planarized employing the same processing steps as in the first embodiment such that the second gate conductor material layer 60 applies the second stress that is different from the first stress to a second portion of the workfunction material layer 40 that is located over the second and fourth semiconductor material portions (30B, 30D). The second and fourth semiconductor material portions are under a second strain due to the second stress.

Source and drains are formed in each of the first, second, third, and fourth semiconductor material portions (30A, 30B, 30C, 30D) such that a p-type field effect transistor is formed in each of the first and second semiconductor material portions (30A, 30B), and an n-type field effect transistor is formed in each of the third and fourth semiconductor material portions (30C, 30D). The first strain and the second strain shift workfunctions of the first and second workfunction material portions differently. Thus, each of the two p-type field effect transistors in the first, second, third, and fourth semiconductor material portions (30A, 30B, 30C, 30D) can have different threshold voltages due to the differences in doping in the channel regions of the p-type and n-type field effect transistors and due to the different shifting of workfunction due to the first strain and the second strain.

Thus, the second exemplary semiconductor structure can include a first p-type field effect transistor (PFET) including the first semiconductor material portion 30A, a first n-type field effect transistor (NFET) including the third semiconductor material portion 30B, a second PFET including the second semiconductor material portion 30C, and a second NFET including the fourth semiconductor material portion 30D. The first PFET and the first NFET include a first workfunction material portion of the workfunction material layer 40 that overlies a channel of the first PFET and a channel of the first NFET, and further includes the first gate conductor material layer 50 applying the first stress to the first workfunction material portion. The second PFET and the second NFET include a second workfunction material portion of the workfunction material layer 40 that overlies a channel of the second PFET and the second NFET, and further includes a second gate conductor material layer 60 applying a second stress that is different from the first stress to the second workfunction material portion. The first workfunction material portion is under a first strain due to the first stress, and the second workfunction material portion is under a second strain due to the second stress. The first and second workfunction material portions have a same composition and a same thickness, and the first strain and the second strain shift workfunctions of the first and second workfunction material portions differently.

The first and second strains can induce volume changes of opposite polarities, or volume changes of the same polarities and of different magnitudes, on the first and second workfunction metal portions.

Referring to FIGS. 12A and 12B, a third exemplary semiconductor structure according to a third embodiment of the present disclosure after formation of a shallow trench isolation structure includes a semiconductor substrate 8', which can be a semiconductor-on-insulator (SOI) substrate or a bulk semiconductor substrate. If the semiconductor substrate 8' is an SOI substrate, the semiconductor substrate 8' can include a handle substrate 10, an insulator layer 20 that is a buried insulator layer, and a top semiconductor layer including a semiconductor material. A shallow trench isolation (STI) structure 22 is formed in the top semiconductor layer such that the top semiconductor layer includes a first semiconductor material portion 130A and a second semiconductor material portion 130B that are laterally surrounded by the STI structure 22. The first semiconductor material portion 130A is a first active region of the top semiconductor layer, and the second semiconductor material portion 130B is a second active region of the top semiconductor layer. The top surfaces of the first semiconductor material portion 130A and the second semiconductor material portion 130B can be, but need not be, substantially coplanar with the top surface of the STI structure 22. The semiconductor material of the first and second semiconductor material portions (130A, 130B) can be the same as the semiconductor material of the first and second semiconductor material portions (30A, 30B) of the first embodiment.

Figure 13A:
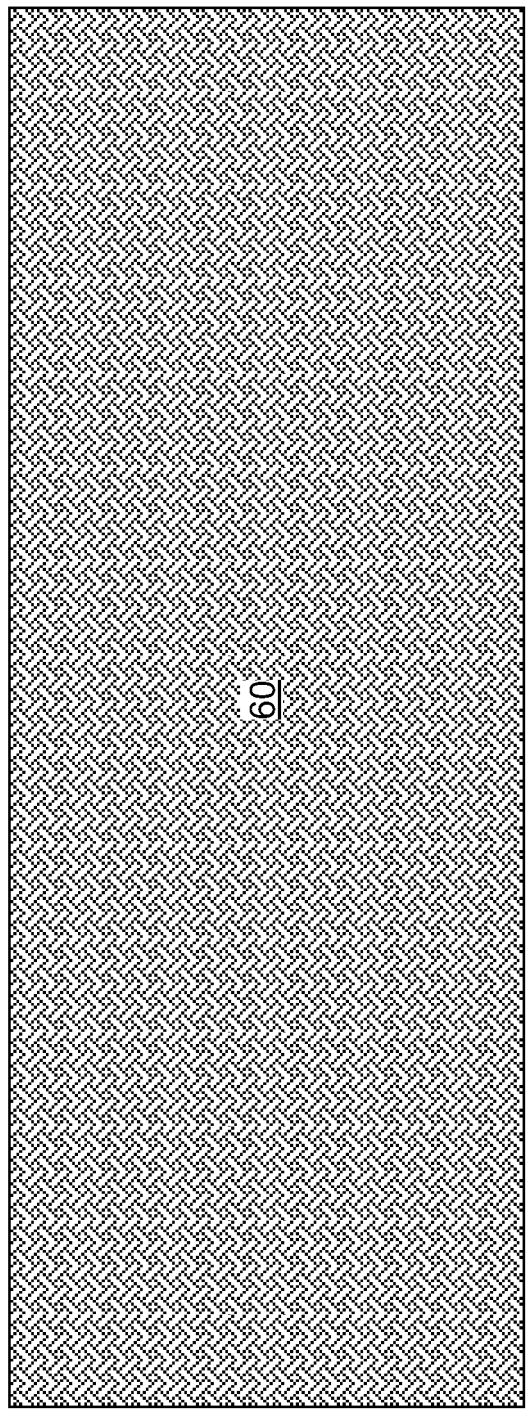
FIG. 13A is a top-down view of the third exemplary semiconductor structure after formation of a gate dielectric layer and a workfunction material layer and formation and planarization of a first and second gate conductor material layers according to the third embodiment of the present disclosure.
Figure 13B:
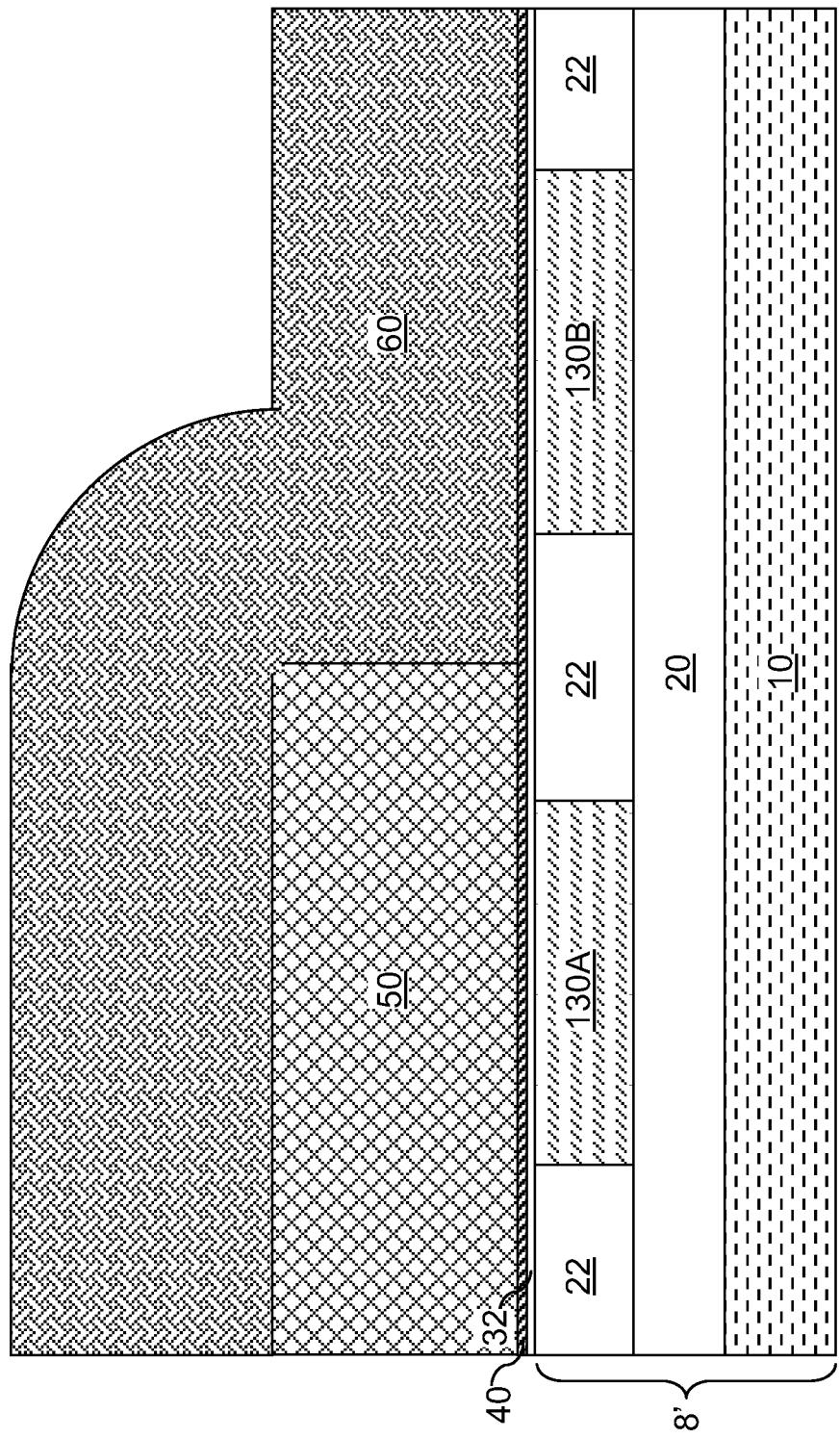
FIG. 13B is a vertical cross-sectional view of the third exemplary semiconductor structure of FIG. 13A.

Referring to FIGS. 13A and 13B, the processing steps of FIGS. 2A, 2B, 3A, 3B, 4A, 4B, 5A, and 5B are performed to deposit a gate dielectric layer 32, a workfunction material layer 40, a first gate conductor material layer 50, to pattern the first gate conductor material layer 50, and to deposit a second gate conductor material layer 60. Each of the gate dielectric layer 32, the workfunction material layer 40, the first gate conductor material layer 50, and the second gate conductor material layer 60 can have the same composition and the same thickness, and can be formed employing the same methods. Further, the workfunction material layer 40, the first gate conductor material layer 50, and the second gate conductor material layer 60 can have the same stress, and the same strain as in the first embodiment.

Referring to FIGS. 14A and 14B, the processing steps of FIGS. 6A, 6B, 7A, 7B, 8A, and 8B are performed. Thus, the first and second gate conductor material layers (50, 60) are planarized, for example, by chemical mechanical planarization (CMP). Portions of the first and second gate conductor material layers (50, 60) that are above a horizontal plane, which is located above the top surface of the workfunction material layer 40, are removed during the planarization. The thickness of the remaining portions of the first and second gate conductor material layers (50, 60) can be from 10 nm to 300 nm, although lesser and greater thicknesses can also be employed. The entirety of the top surface of the first and second gate conductor material layers (50, 60) can be coplanar after the planarization. The first gate conductor material layer 50 is present over the first semiconductor material portion 130A and the first workfunction material portion that is in contact with the first conductor material layer 50, and the second gate conductor material layer 60 is present over the second semiconductor material portion 130B and the second workfunction material portion that is in contact with the second conductor material layer 60.

The first and second gate conductor material layers (50, 60) and the workfunction material layer 40 are lithographically patterned to form gate electrodes. For example, a first gate electrode formed over the first semiconductor material portion 130A includes a remaining portion of the first gate conductor material layer 50 and a remaining portion of the first workfunction material portion of the workfunction material layer 40, and a second gate electrode formed over the second semiconductor material portion 130B includes a remaining portion of the second gate conductor material layer 60 and a remaining portion of the second workfunction material portion of the workfunction material layer 40. The first gate conductor material layer 50 in the first gate electrode applies the first stress to, and induces the first strain in, the first workfunction material portion of the workfunction material layer 40, and the second gate conductor material layer 60 in the second gate electrode applies the second stress to, and induces the second strain in, the second workfunction material portion of the workfunction material layer 40. Thus, the workfunctions of the first and second workfunction material portions of the workfunction material layer 40 are shifted differently from the workfunction at an unstrained state. The gate dielectric layer 32 may, or may not, be patterned.

Various source/drain extension implantation and halo implantations can be performed employing masked ion implantation processes to form source/drain extension regions (not explicitly marked in drawings) and/or halo implantation regions (not explicitly marked). A gate spacer 70 can be formed around each of the first and second gate electrodes (40, 50, 60), for example, by depositing a conformal dielectric material layer and anisotropically removing horizontal portions of the conformal dielectric material layer. Various source/drain implantation can be performed employing masked ion implantation processes to form source/drain regions (not explicitly marked).

Figure 15A:
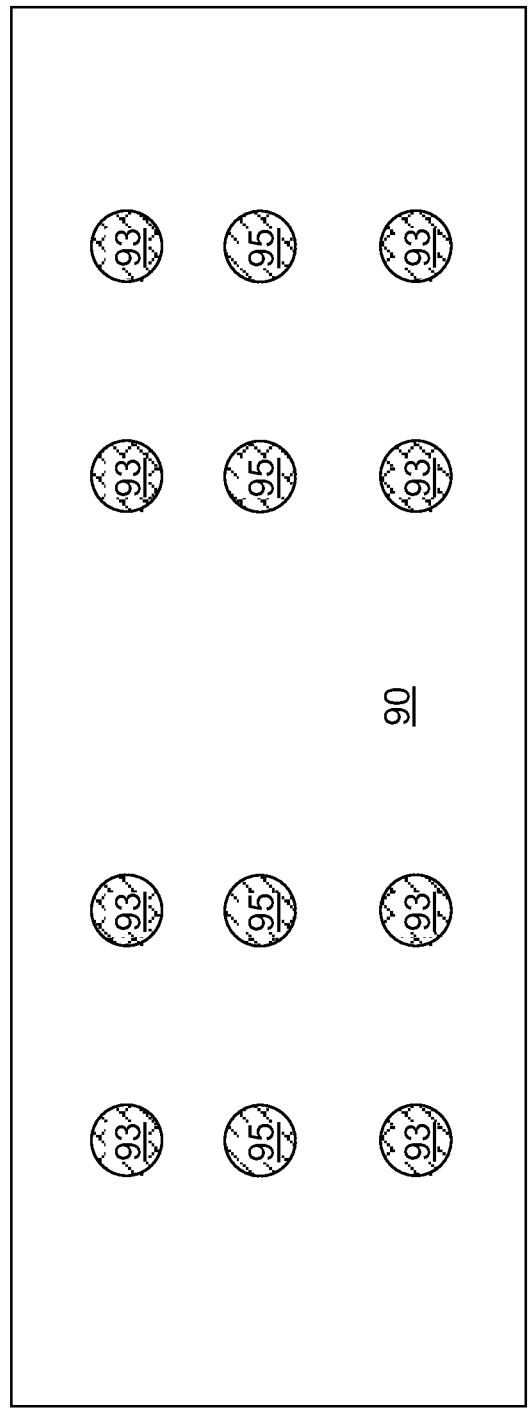
FIG. 15A is a top-down view of the third exemplary semiconductor structure after formation of a contact-level dielectric layer and various contact via structures according to the third embodiment of the present disclosure.
Figure 15B:
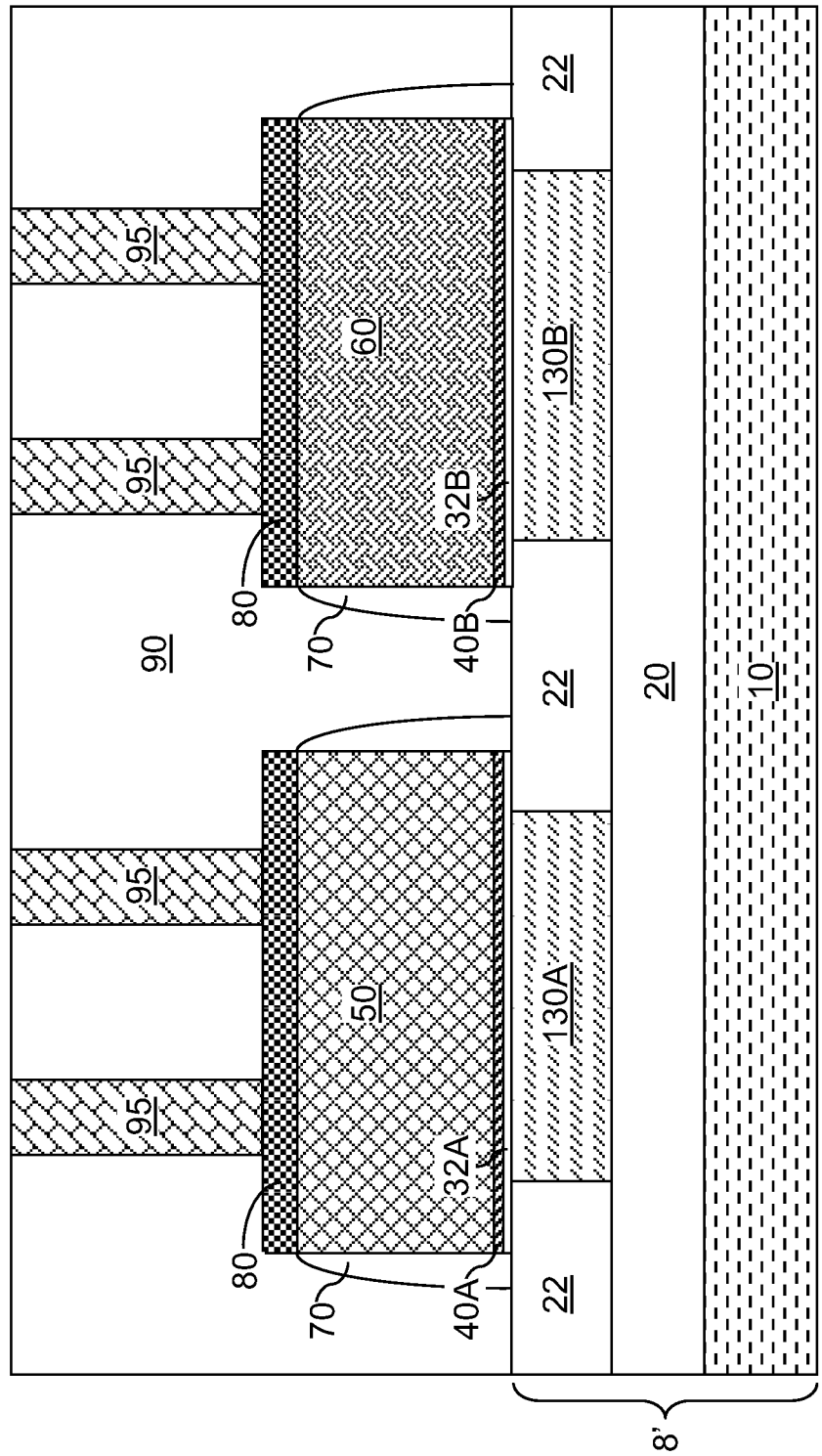
FIG. 15B is a vertical cross-sectional view of the third exemplary semiconductor structure of FIG. 10A.

Referring to FIGS. 15A and 15B, various metal semiconductor alloy portions can be formed, for example, by depositing a metal layer on various semiconductor material portions and inducing formation of a metal semiconductor alloy such as a metal silicide, a metal germanide, and/or a metal germano-silicide. For example, first source/drain metal semiconductor alloy portions (not shown) can be formed on top surfaces and/or sidewall surfaces of the first semiconductor material portion 130A, which includes a source region, a drain region, and a body region of a first field effect transistor, and second source/drain metal semiconductor alloy portions (not shown) can be formed on top surfaces and/or sidewall surfaces of the second semiconductor material portion 130B, which includes a source region, a drain region, and a body region of a second field effect transistor. If the first gate conductor material layer 50 and/or the second gate conductor material layer 60 includes a semiconductor material, a gate-side metal semiconductor alloy portion 80 can be formed on the semiconductor material(s) of the first gate conductor material layer 50 and/or the second gate conductor material layer 60.

The first field effect transistor includes the first semiconductor material portion 130A, a first stack of a first portion of a gate dielectric layer 32 and the first workfunction material portion of the workfunction material layer 40 located over the first semiconductor material portion 130A, and the first gate conductor material layer 50 applying the first stress to the first workfunction material portion. The first workfunction material portion is under the first strain due to the first stress. The second field effect transistor includes the second semiconductor material portion 130B, a second stack of a second portion of the gate dielectric layer 32 and the second workfunction material portion of the workfunction material layer 40 located over the second semiconductor material portion 130B, the second gate conductor material layer 60 applying the second stress that is different from the first stress to the second workfunction material portion. The second workfunction material portion is under the second strain due to the second stress. The first strain and the second strain shift workfunctions of the first and second workfunction material portions differently in magnitude, in polarity, or in magnitude and polarity. The first field effect transistor and the second field effect transistors can be of the same polarity, i.e., two p-type transistors or two n-type transistors, or can be of the opposite polarities, i.e., a p-type field effect transistor and an n-type field effect transistor.

A contact-level dielectric layer 90 is deposited over the first gate conductor material layer 50 and/or the second gate conductor material layer 60 and the first and second semiconductor material portions (130A, 130B). The contact-level dielectric layer 90 can be planarized, for example, by chemical mechanical planarization. Various contact via structures can be formed, for example, by forming contact via holes in the contact-level dielectric layer 90 and filling the contact via holes with a conductive material. The various contact via structures can include, for example, gate contact via structures 95 and source/drain contact via structures 93.

Figure 16:
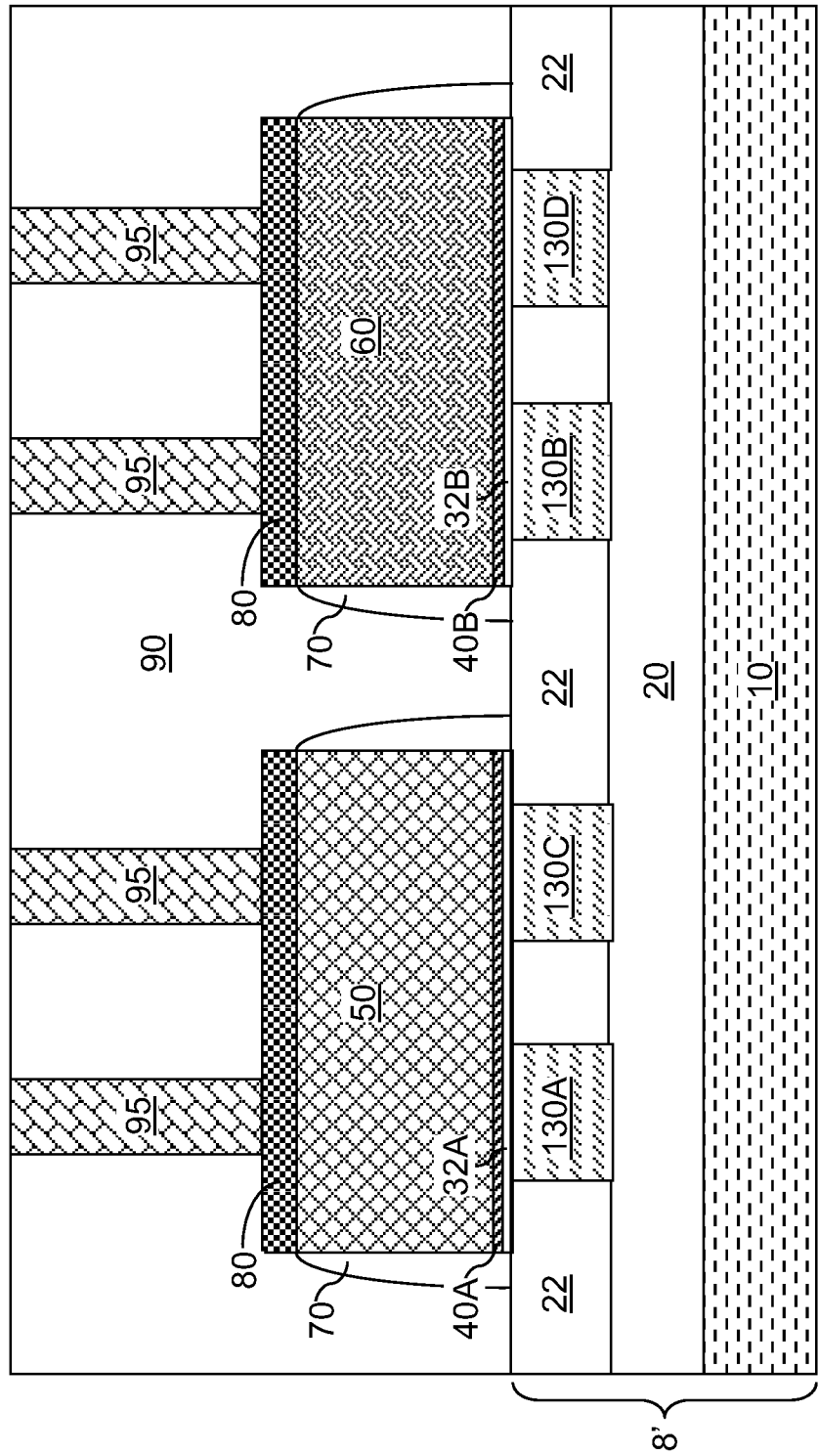
FIG. 16 is a vertical cross-sectional view of a fourth exemplary semiconductor structure according to a fourth embodiment of the present disclosure.

Referring to FIG. 16, a fourth exemplary semiconductor structure according to a fourth embodiment of the present disclosure can be derived from the first exemplary semiconductor structure by forming a first plurality of semiconductor material fins, such as active regions, in a first area in which the first gate conductor layer 50 contacts the workfunction material layer 40 (See FIGS. 14A and 14B), and by forming a second plurality of semiconductor material portions, such as active regions, in a second area in which the second gate conductor layer 60 contacts the workfunction material layer 40 (See FIGS. 14A and 14B).

For example, a first semiconductor material portion 130A, a second semiconductor material portion 130B, a third semiconductor material portion 130C, and a fourth semiconductor material portion 130D are formed over an insulator layer 20 in the substrate 8'. A stack of the gate dielectric layer 32 and the workfunction material layer 40 is formed over the first, second, third, and fourth semiconductor material portions (130A, 130B, 130C, 130D). The first gate conductor material layer 50 is formed and planarized employing the same processing steps as in the third embodiment such that the first gate conductor material layer 50 applies the first stress to the first workfunction material portion of the workfunction material layer 40 that is located over the first and third semiconductor material portions (130A, 130C). The first and third workfunction material portions are under a first strain due to the first stress. The second gate conductor material layer 60 is formed and planarized employing the same processing steps as in the first embodiment such that the second gate conductor material layer 60 applies the second stress that is different from the first stress to a second portion of the workfunction material layer of the workfunction material layer 40 that is located over the second and fourth semiconductor material portions (130B, 130D). The second and fourth semiconductor material portions are under a second strain due to the second stress.

Source and drains are formed in each of the first, second, third, and fourth semiconductor material portions (130A, 130B, 130C, 130D) such that a p-type field effect transistor is formed in each of the first and second semiconductor material portions (130A, 130B), and an n-type field effect transistor is formed in each of the third and fourth semiconductor material portions (130C, 130D). The first strain and the second strain shift workfunctions of the first and second workfunction material portions differently. Thus, each of the two p-type field effect transistors in the first, second, third, and fourth semiconductor material portions (30A, 30B, 30C, 30D) can have different threshold voltages due to the differences in doping in the channel regions of the p-type and n-type field effect transistors and due to the different shifting of workfunction due to the first strain and the second strain.

Thus, the second exemplary semiconductor structure can include a first p-type field effect transistor (PFET) including the first semiconductor material portion 130A, a first n-type field effect transistor (NFET) including the third semiconductor material portion 130B, a second PFET including the second semiconductor material portion 130C, and a second NFET including the fourth semiconductor material portion 130D. The first PFET and the first NFET include a first workfunction material portion of the workfunction material layer 40 that overlies a channel of the first PFET and a channel of the first NFET, and further includes the first gate conductor material layer 50 applying the first stress to the first workfunction material portion. The second PFET and the second NFET include a second workfunction material portion of the workfunction material layer 40 that overlies a channel of the second PFET and the second NFET, and further includes a second gate conductor material layer 60 applying a second stress that is different from the first stress to the second workfunction material portion. The first workfunction material portion is under a first strain due to the first stress, and the second workfunction material portion is under a second strain due to the second stress. The first and second workfunction material portions have a same composition and a same thickness, and the first strain and the second strain shift workfunctions of the first and second workfunction material portions differently.

The first and second strains can induce volume changes of opposite polarities, or volume changes of the same polarities and of different magnitudes, on the first and second workfunction metal portions.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A semiconductor structure comprising:
a first field effect transistor including a first semiconductor material portion, a first stack of a first portion of a gate dielectric layer and a first workfunction material portion located over said first semiconductor material portion, and a first gate conductor material layer applying a first stress to said first workfunction material portion, wherein said first workfunction material portion is under a first strain due to said first stress; and
a second field effect transistor including a second semiconductor material portion, a second stack of a second portion of said gate dielectric layer and a second workfunction material portion located over said second semiconductor material portion, a second gate conductor material layer applying a second stress that is different from said first stress to said second workfunction material portion, wherein said second workfunction material portion is under a second strain due to said second stress, and said first strain and said second strain shift workfunctions of said first and second workfunction material portions differently, wherein said first semiconductor material portion and said second semiconductor material portion comprise a first semiconductor fin located on an insulating layer and a second semiconductor fin located on said insulating layer.

2. The semiconductor structure of claim 1, wherein said first and second strains induce volume changes of opposite polarities on said first and second workfunction metal portions.

3. The semiconductor structure of claim 1, wherein one of said first and second stress is compressive, and another of said first and second stress is tensile.

4. The semiconductor structure of claim 1, wherein one of said first and second gate conductor material layers comprises at least one semiconductor material and is doped with a first element having an atomic size greater than an average atomic size of said at least one semiconductor material, and another of said first and second gate conductor material layers comprises said at least one semiconductor material and is doped with a second element having an atomic size smaller than said average atomic size of said at least one semiconductor material.

5. The semiconductor structure of claim 1, wherein one of said first and second gate conductor material layers comprises a first metallic material, and another of said first and second gate conductor material layers comprises a second metallic material different from said first metallic material.

6. The semiconductor structure of claim 1 wherein one of said first and second gate conductor material layers comprises a metallic material, and another of said first and second gate conductor material layers comprises a semiconductor material.

7. A semiconductor structure comprising a first p-type field effect transistor (PFET), a first n-type field effect transistor (NFET), a second PFET, and a second NFET located on a substrate, wherein said first PFET and said first NFET comprise a first workfunction material portion overlying a channel of said first PFET and a channel of said first NFET and a first gate conductor material layer applying a first stress to said first workfunction material portion, and said second PFET and said second NFET comprise a second workfunction material portion overlying a channel of said second PFET and a channel of said second NFET and a second gate conductor material layer applying a second stress that is different from said first stress to said second workfunction material portion, wherein said first workfunction material portion is under a first strain due to said first stress and said second workfunction material portion is under a second strain due to said second stress, and said first and second workfunction material portions have a same composition and a same thickness, and said first strain and said second strain shift workfunctions of said first and second workfunction material portions differently.

8. The semiconductor structure of claim 7, wherein said first and second strains induce volume changes of opposite polarities on said first and second workfunction metal portions.

9. The semiconductor structure of claim 7, wherein said first and second strains induce volume changes of opposite polarities on said first and second workfunction metal portions.

10. The semiconductor structure of claim 7, wherein one of said first and second stress is compressive, and another of said first and second stress is tensile.

11. The semiconductor structure of claim 7, wherein one of said first and second gate conductor material layers comprises at least one semiconductor material and is doped with a first element having an atomic size greater than an average atomic size of said at least one semiconductor material, and another of said first and second gate conductor material layers comprises said at least one semiconductor material and is doped with a second element having an atomic size smaller than said average atomic size of said at least one semiconductor material.

12. The semiconductor structure of claim 7, wherein one of said first and second gate conductor material layers comprises a first metallic material, and another of said first and second gate conductor material layers comprises a second metallic material different from said first metallic material.

13. The semiconductor structure of claim 7 wherein one of said first and second gate conductor material layers comprises a metallic material, and another of said first and second gate conductor material layers comprises a semiconductor material.

14. The semiconductor structure of claim 7, wherein said first semiconductor material portion and a second semiconductor material portion comprise a first semiconductor fin located on an insulating layer and a second semiconductor fin located on said insulating layer.

15. A semiconductor structure comprising:
a first field effect transistor including a first semiconductor material portion, a first stack of a first portion of a gate dielectric layer and a first workfunction material portion located over said first semiconductor material portion, and a first gate conductor material layer applying a first stress to said first workfunction material portion, wherein said first workfunction material portion is under a first strain due to said first stress; and
a second field effect transistor including a second semiconductor material portion, a second stack of a second portion of said gate dielectric layer and a second workfunction material portion located over said second semiconductor material portion, a second gate conductor material layer applying a second stress that is different from said first stress to said second workfunction material portion, wherein said second workfunction material portion is under a second strain due to said second stress, and said first strain and said second strain shift workfunctions of said first and second workfunction material portions differently, wherein one of said first and second gate conductor material layers comprises at least one semiconductor material and is doped with a first element having an atomic size greater than an average atomic size of said at least one semiconductor material, and another of said first and second gate conductor material layers comprises said at least one semiconductor material and is doped with a second element having an atomic size smaller than said average atomic size of said at least one semiconductor material.

16. A semiconductor structure comprising:
a first field effect transistor including a first semiconductor material portion, a first stack of a first portion of a gate dielectric layer and a first workfunction material portion located over said first semiconductor material portion, and a first gate conductor material layer applying a first stress to said first workfunction material portion, wherein said first workfunction material portion is under a first strain due to said first stress; and
a second field effect transistor including a second semiconductor material portion, a second stack of a second portion of said gate dielectric layer and a second workfunction material portion located over said second semiconductor material portion, a second gate conductor material layer applying a second stress that is different from said first stress to said second workfunction material portion, wherein said second workfunction material portion is under a second strain due to said second stress, and said first strain and said second strain shift workfunctions of said first and second workfunction material portions differently, wherein one of said first and second gate conductor material layers comprises a first metallic material, and another of said first and second gate conductor material layers comprises a second metallic material different from said first metallic material.

* * * * *